(12) United States Patent
Sekiguchi et al.

(10) Patent No.: US 8,354,946 B2
(45) Date of Patent: Jan. 15, 2013

(54) DIGITAL SIGNAL CODING METHOD AND APPARATUS, DIGITAL SIGNAL DECODING APPARATUS, DIGITAL SIGNAL ARITHMETIC CODING METHOD AND DIGITAL SIGNAL ARITHMETIC DECODING METHOD

(75) Inventors: Shunichi Sekiguchi, Tokyo (JP); Yoshihisa Yamada, Tokyo (JP); Kohtaro Asai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 179 days.

(21) Appl. No.: 12/985,203

(22) Filed: Jan. 5, 2011

(65) Prior Publication Data

US 2011/0095922 A1 Apr. 28, 2011

Related U.S. Application Data

(62) Division of application No. 12/862,183, filed on Aug. 24, 2010, now Pat. No. 7,928,869, which is a division of application No. 12/367,266, filed on Feb. 6, 2009, now Pat. No. 7,859,438, which is a division of application No. 12/032,449, filed on Feb. 15, 2008, now Pat. No. 7,518,537, which is a division of application No. 11/781,682, filed on Jul. 23, 2007, now Pat. No. 7,408,488, which is a division of application No. 11/797,462, filed on May 3, 2007, now Pat. No. 7,388,526, which is a division of application No. 11/325,439, filed on Jan. 5, 2006, now Pat. No. 7,321,323, which is a division of application No. 10/480,046, filed as application No. PCT/JP03/04578 on Apr. 10, 2003, now Pat. No. 7,095,344.

(30) Foreign Application Priority Data

Apr. 25, 2002 (JP) ................................. 2002-124114

(51) Int. Cl.
*H03M 7/00* (2006.01)

(52) U.S. Cl. ........... 341/107; 341/51; 341/106; 382/247

(58) Field of Classification Search .................. 341/107; 382/247

See application file for complete search history.

(56) References Cited

U.S. PATENT DOCUMENTS 4,891,643 A 1/1990 Mitchell et al.
(Continued)

FOREIGN PATENT DOCUMENTS

JP 7-99452 A 4/1995
(Continued)

OTHER PUBLICATIONS

Chen H. et al: "Burst Error Recovery for VF Arithmetic Coding" IEICE Transactions on Fundamentals of Electronics, Communications and Computer Sciences, Engineering Sciences Society, Tokyo, JP, vol. E84-A, No. 4, Apr. 2001, pp. 1050-1063, XP001050994, ISSN: 0916-8508.

(Continued)

*Primary Examiner* — Khai M Nguyen
(74) *Attorney, Agent, or Firm* — Birch, Stewart, Kolasch & Birch, LLP

(57) ABSTRACT

A digital decoding apparatus and method for receiving and decoding a compression-coded digital signal in predetermined transmission units is disclosed. The decoding apparatus includes initialization unit for initializing an arithmetic coding process based on information of initializing a table of probability of occurrence which is multiplexed on a header of data for the predetermined transmission units and information of initializing a register value which shows the arithmetic decoding process, a context model determination unit for determining a context model to be used for each type of decoded data among a plurality of context models, a binarization unit for generating a binarization rule defined based on the type of decoded data, a probability of occurrence generation unit for providing a probability of occurrence corresponding to the context model determined by the binarization rule, and an arithmetic decoding unit for arithmetic decoding based on the generated probability of occurrence and the initialized register value.

4 Claims, 19 Drawing Sheets

U.S. PATENT DOCUMENTS

| | | | |
|---|---|---|---|
| 4,905,297 | A | 2/1990 | Langdon et al. |
| 5,555,323 | A | 9/1996 | Hongu |
| 5,587,710 | A | 12/1996 | Choo et al. |
| 5,592,163 | A | 1/1997 | Kimura et al. |
| 5,654,702 | A * | 8/1997 | Ran .................................. 341/51 |
| 6,049,633 | A | 4/2000 | Cho |
| 6,108,449 | A * | 8/2000 | Sekiguchi et al. ............ 382/236 |
| 6,116,768 | A | 9/2000 | Guttag et al. |
| 6,188,795 | B1 | 2/2001 | Brady et al. |
| 6,229,463 | B1 * | 5/2001 | Van Der Vleuten et al. .. 341/107 |
| 6,265,997 | B1 * | 7/2001 | Nomizu ....................... 341/107 |
| 6,275,176 | B1 | 8/2001 | Bruekers et al. |
| 6,542,644 | B1 | 4/2003 | Satoh |
| 6,677,868 | B2 | 1/2004 | Kerofsky et al. |
| 6,856,701 | B2 | 2/2005 | Karczewicz et al. |
| 6,864,813 | B2 * | 3/2005 | Horie ........................... 341/107 |
| 7,095,344 | B2 * | 8/2006 | Sekiguchi et al. ............ 341/107 |
| 7,130,475 | B2 * | 10/2006 | Kim et al. ..................... 382/246 |
| 7,228,001 | B2 * | 6/2007 | Kobayashi et al. ........... 382/247 |
| 7,321,323 | B2 | 1/2008 | Sekiguchi et al. |
| 7,408,488 | B2 | 8/2008 | Sekiguchi et al. |
| 2002/0021234 | A1 | 2/2002 | Yanagiya et al. |

FOREIGN PATENT DOCUMENTS

| | | |
|---|---|---|
| JP | 7-170196 A | 7/1995 |
| JP | 9-121168 A | 5/1997 |
| JP | 10-215228 A | 8/1998 |
| JP | 11-274928 A | 10/1999 |
| JP | 1275263 A | 11/2000 |
| JP | 2001-292328 A | 10/2001 |
| KR | 1999-0066516 | 8/1999 |
| KR | 1999-0075942 A | 10/1999 |

OTHER PUBLICATIONS

Clarke M. et al., "Optimum delivery of telemedicine over low bandwidth satellite links" Proceedings of the 23rd. Annual International Conference of the IEEE Engineering in Medicine and Biology Society . 2001 Conference Proceedings. (EMBS). Instanbul, Turkey Oct. 25-28, 2001, Annual International Conference of the IEE.

Detlev Marpe et al., International Conference on Image Processing 2001, pp. 1-4.

Mark Nelson, Dr. Dobb's Journal, Feb. 1991, 6 pages.

S. H. Park, Y. B. Thomas Kim and S. W. Kim , "Core Experiment Proposal on Complexity Reduction and Error Resilience for BSAC", Samsung AIT, ISO/IEC JTC1/SC29/WWG11, MPEG99/M4817, Jul. 1999, XP030034037.

Sodagar I. et al., "A new error resilience technique for image compression using arithmetic coding" Acoustics, Speech, and Signal Processing, 2000. ICASSP '00. Proceedings. 2000 IEEE International Conference on Jun. 5-9, 2000, vol. 6, Jun. 5, 2000, pp. 2127-2130, XP010504719.

Wiegand Thomas: "Joint Video Team (JVT) of ISO/IEC MPEG and ITU-T VCEG" Conference Proceedings Article Joint Video Team (JVT) of ISO/IEC MPEG and ITU-T, Mar. 13, 2002, pp. 1-105, XP002373040.

Y. Kikuchi et al., RFC3016, The International Society, Nov. 2000, pp. 1-20.

Nelson, Mark et al., "The Data Compression Book, Second Edition," M&T Books, 5 pages, XP-002615565, 1995.

Detlev Marpe et al.: "Improved CABAC", ITU Study Group 16—Video Coding Experts Group—ISO/IEC MPEG & ITU-T VCEG (ISO/IEC JTC1/SC29/WG11 and ITU-T SG16 Q6) No. VCEG-018, Nov. 28, 2001), XP030003351.

* cited by examiner

FIG.1

| CHARACTERS | PROBABILITY OF OCCURRENCE | RANGE |
|---|---|---|
| SPACE | 1/10 | 0.00 - 0.10 |
| A | 1/10 | 0.10 - 0.20 |
| B | 1/10 | 0.20 - 0.30 |
| E | 1/10 | 0.30 - 0.40 |
| G | 1/10 | 0.40 - 0.50 |
| I | 1/10 | 0.50 - 0.60 |
| L | 2/10 | 0.60 - 0.80 |
| S | 1/10 | 0.80 - 0.90 |
| T | 1/10 | 0.90 - 1.00 |

FIG.2

| CHARACTERS CODED | Low | High |
|---|---|---|
|  | 0.0 | 1.0 |
| B | 0.2 | 0.3 |
| I | 0.25 | 0.26 |
| L | 0.256 | 0.258 |
| L | 0.2572 | 0.2576 |
| SPACE | 0.25720 | 0.25724 |
| G | 0.257216 | 0.257220 |
| A | 0.2572164 | 0.2572168 |
| T | 0.25721676 | 0.2572168 |
| E | 0.257216772 | 0.257216776 |
| S | 0.2572167752 | 0.2572167756 |

DIGITAL SIGNAL CODING METHOD AND APPARATUS, DIGITAL SIGNAL DECODING APPARATUS, DIGITAL SIGNAL ARITHMETIC CODING METHOD AND DIGITAL SIGNAL ARITHMETIC DECODING METHOD

CROSS REFERENCE TO RELATED APPLICATIONS

This application is a Divisional of application Ser. No. 12/862,183, now U.S. Pat. No. 7,928,869 filed on Aug. 24, 2010, which is a Divisional of application Ser. No. 12/367, 266, now U.S. Pat. No. 7,859,438 filed on Feb. 6, 2009,which is a Divisional of application Ser. No. 12/032,449, now U.S. Pat. No. 7,518,537 filed on Feb. 15, 2008, which is a Divisional of application Ser. No. 11/781,682, now U.S. Pat. No. 7,408,488 filed on Jul. 23, 2007, which is a Divisional of 11/797,462, now U.S. Pat. No. 7,388,526 now U.S. Pat. No. 7,388,526 filed on May 3, 2007, which is a Divisional of application Ser. No. 11/325,439, now U.S. Pat. No. 7,321,323 filed on Jan. 5, 2006, which is a Divisional of application Ser. No. 10/480,046, now U.S. Pat. No. 7,095,344 filed on Dec. 9, 2003, for which priority is claimed under 35 U.S.C. §120. application Ser. No. 10/480,046 now U.S. Pat. No. 7,095,344 is the national phase of PCT International Application No. PCT/JP03/04578 filed on Apr. 10, 2003 under 35 U.S.C. §371, which international application claims priority under 35 U.S.C. §119(a)-(d) on Japanese Application No. 2002-124114, filed on Apr. 25, 2002. The entire contents of each of these applications are hereby incorporated by reference.

TECHNICAL FIELD

The present invention relates to a digital signal coding apparatus, a digital signal decoding apparatus, a digital signal arithmetic coding method and a digital signal arithmetic decoding method used for video compression coding and compressed video data transmission.

BACKGROUND ART

In International standards for video coding such as MPEG and ITU-T H.26x, Huffman coding has been used for entropy coding. Huffman coding provides an optimum coding performance when individual information symbols are to be represented as individual codewords. Optimum performance is not, however, guaranteed when a signal such as a video signal exhibits localized variation so that the probability of appearance of information symbols varies.

Arithmetic coding is proposed as a method that adapts dynamically to the probability of appearance of individual information symbols and is capable of representing a plurality of symbols as a single codeword.

The concept behind arithmetic coding will be outlined by referring to Mark Nelson, "Arithmetic Coding+Statistical Modeling=Data Compression Part 1–Arithmetic Coding", Dr. Dobb's Journal, February 1991. It is assumed that an information source generates information symbols comprising alphabets and a message "BILL GATES" is arithmetically coded.

The probability of appearance of individual characters is defined as shown in FIG. 1. As indicated in a column "RANGE" of FIG. 1, portions of a probability line defined by a segment [0, 1) are uniquely established for respective characters.

Subsequently, the characters are subject to a coding process. First, the letter "B" is coded. This is done in the form of identifying a range [0.2, 0.3) on the probability line for that character. Therefore, the letter "B" corresponds to a set of High value and a Low value in the range [0.2, 0.3).

To code "I" subsequently, the range [0.2, 0.3) identified in the process of coding "B" is regarded as a new segment [0, 1) so that a sub-segment [0.5, 0.6) is identified therein. The process of arithmetic coding is a process of successively bounding rages on the probability line.

Repeating the process for the characters, the result of arithmetic coding of "BILL GATES" is represented as a Low value "0.2572167752" of a segment after the coding of the letter "S" is completed.

A decoding process is an inverse of the coding process.

First, the coding result "0.2572167752" is examined to determine a range on the probability line in which the result lies and determine a character assigned to the range. In this case, we restore "B".

Thereafter, the Low value for "B" is subtracted from the result and the resultant value is divided by the magnitude of the range of "B", producing "0.572167752". This enables us to restore "I" corresponding to the segment [0.5, 0.6). The process is repeated until "BILL GATES" is restored by decoding.

By performing an arithmetic coding as described above, a message of extreme length could be mapped onto a single codeword. In actual implementation, it is impossible to operate with infinite decimal precision. Moreover, multiplication and division are necessary for coding and decoding so that heavy computational load is imposed. These problems are addressed by floating-point decimal computation using, for codeword representation, registers of an integer type. The Low value is approximated by a power of 2 so that multiplication and division are replaced by shift operations. Ideally, arithmetic coding according to the above-described process enables entropy coding adapted to the probability of occurrence of information symbols. More specifically, when the probability of occurrence varies dynamically, the coding efficiency higher than that of Huffman coding is available by tracing the variation and updating the table of FIG. 1 appropriately.

Since the digital signal arithmetic coding method and digital arithmetic decoding method according to the related art are configured as described above, each video frame is divided into segments for transmission in units that allows resynchronization (for example, MPEG-2 slice structure) in order to minimize degradation occurring in an entropy-coded video signal due to transmission errors.

Huffman coding maps individual coding symbols into codewords of an integer bit length so that transmission unit is immediately defined as a group of codewords. In arithmetic coding, however, a special code for explicitly suspending a coding process is required. In addition, for resumption of coding, the process of learning the probability of occurrence of earlier symbols should be reset so as to output bits for establishing a code. As a result, the coding efficiency may suffer prior to and subsequent to the suspension. Another problem to be addressed is that, when an arithmetic coding process is not reset while coding a video frame and the frame has to be divided into small units such as packet data for transmission, decoding of a packet cannot take place without the immediately preceding packet data so that significant adverse effects on video quality result when a transmission error or a packet loss due to a delay occurs. The present invention addresses these problems and has an objective of providing a digital signal coding apparatus and a digital signal coding method capable of ensuring a high degree of error resiliency and improving a coding efficiency of arithmetic coding.

The present invention has a further objective of providing a digital signal decoding apparatus and a digital signal decoding method capable of proper decoding in a situation where the coding apparatus continues coding across bounds of transmission units, by inheriting, instead of resetting, the arithmetic coding status for earlier transmission units or the symbol probability learning status.

DISCLOSURE OF THE INVENTION

According to an aspect of the present invention, a digital decoding apparatus for receiving and decoding a compression-coded digital signal in predetermined transmission units is disclosed. The decoding apparatus includes an initialization unit for initializing an arithmetic coding process based on information of initializing a table of probability of occurrence which is multiplexed on a header of data for the predetermined transmission units and information of initializing a register value which shows the arithmetic decoding process, a context model determination unit for determining a context model to be used for each type of decoded data among a plurality of context models, a binarization unit for generating a binarization rule defined based on the type of decoded data, a probability of occurrence generation unit for providing a probability of occurrence corresponding to the context model determined by the binarization rule, and an arithmetic decoding unit for arithmetic decoding based on the generated probability of occurrence and the initialized register value.

With this, it is possible to continue coding across bounds of transmission units by inheriting, instead of resetting, the earlier arithmetic coding status or the symbol probability learning status. Thus, a high degree of error resilience and an improved coding efficiency of arithmetic coding result.

According to a further aspect of the present invention, a digital decoding method for receiving and decoding a compression-coded digital signal in predetermined transmission units is disclosed. The decoding method includes an initialization step for initializing an arithmetic coding process based on information of initializing a table of probability of occurrence which is multiplexed on a header of data for the predetermined transmission units and information of initializing a register value which shows the arithmetic decoding process, a context model determination step for determining a context model to be used for each type of decoded data among a plurality of context models, a binarization step for generating a binarization rule defined based on the type of decoded data, a probability of occurrence generation step for providing a probability of occurrence corresponding to the context model determined by the binarization rule, and an arithmetic decoding step for arithmetic decoding based on the generated probability of occurrence and the initialized register value.

With this, proper decoding is possible in a situation where the coding apparatus continues coding across bounds of transmission units, by inheriting, instead of resetting, the arithmetic coding status for earlier transmission units or the probability learning status.

BRIEF DESCRIPTION OF THE DRAWINGS

FIG. 1 shows the probability of occurrence of individual characters when a phrase "BILL GATES" is arithmetically coded.

FIG. 2 shows an arithmetic coding result when the phrase "BILL GATES" is arithmetically coded.

BEST MODE FOR CARRYING OUT THE INVENTION

Hereinafter, details of the invention will be explained by describing the best mode for carrying out the invention with reference to the attached drawings.

First Embodiment

A first embodiment of the present invention is presented using an example, disclosed in D. Marpe et al. "Video Compression Using Context-Based Adaptive Arithmetic Coding", International Conference on Image Processing 2001, in which arithmetic coding is applied to a video coding scheme where a square area of 16×16 pixels (hereinafter, referred to as a macroblock) produced by uniformly dividing a video frame is a coding unit.

Figure 3:
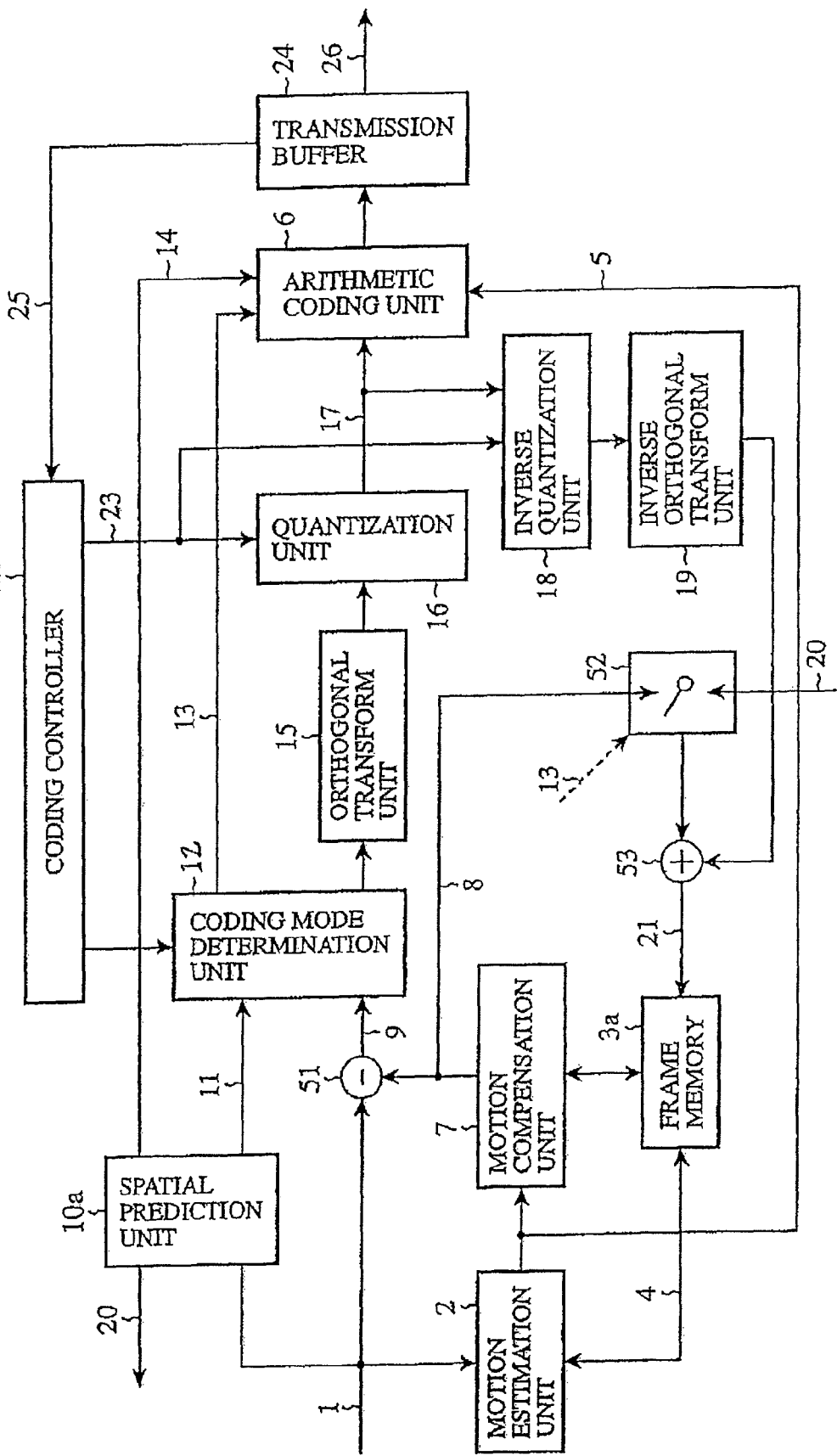
FIG. 3 shows a construction of a video coding apparatus (digital signal coding apparatus) according to a first embodiment of the present invention.

FIG. 3 shows a construction of a video coding apparatus (digital signal coding apparatus) according to the first embodiment of the present invention. Referring to FIG. 3, a motion estimation unit 2 extracts a motion vector 5 for each of the macroblocks of an input video signal 1, using a reference image 4 stored in a frame memory 3a. A motion compensation unit 7 constructs a temporal predicted image 8 based on the motion vector 5 extracted by the motion estimation unit 2. A subtractor 51 determines a difference between the input video signal 1 and the predicted image 8 and outputs the difference as an temporal prediction error signal 9.

A spatial prediction unit 10a refers to the input video signal 1 so as to generate a spatial prediction error signal 11 by making a prediction from spatially neighboring areas in a given video frame. A coding mode determination unit 12 selects a mode capable of coding a target macroblock most efficiently and outputs coding mode information 13, the mode selected by the code mode determination unit 12 being one of a motion compensation mode for coding the temporal prediction error signal 9, a skip mode for a case where the motion vector 5 is zero and the temporal prediction error signal 9 has a null component, and an intra mode for coding the spatial prediction error signal 11.

An orthogonal transform unit 15 subjects the signal selected for coding by the coding mode determination unit 12 to orthogonal transform so as to output orthogonal transform coefficient data. A quantization unit 16 quantizes the orthogonal transform coefficient data with a granularity indicated by a quantization step parameter 23 determined by a coding controller 22.

An inverse quantization unit 18 subjects orthogonal transform coefficient data 17 output from the quantization unit 16 with the granularity indicated by the quantization step parameter 23. An inverse orthogonal transform unit 19 subjects the orthogonal transform coefficient data subjected to inverse quantization by the inverse quantization unit 18. A switching unit 52 selects for output the temporal predicted image 8 output from the motion compensation unit 7 or a spatial predicted image 20 output from the spatial prediction unit 10a, in accordance with the coding mode information 13 output from the coding mode determination unit 12. An adder 53 adds the output signal from the switching unit 52 to the output signal from the inverse orthogonal unit 19 so as to generate a local decoded image 21 and stores the locally decoded image 21 in the frame memory 3a as the reference image 4.

An arithmetic coding unit 6 subjects coding data including the motion vector 5, the coding mode information 13, an spatial prediction mode 14, the orthogonal transform coefficient data 17 to entropy coding, so as to output a coding result via a transmission buffer 24 as compressed video data 26. The coding controller 22 controls components including the coding mode determination unit 12, the quantization unit 16 and the inverse quantization unit 18.

Figure 4:
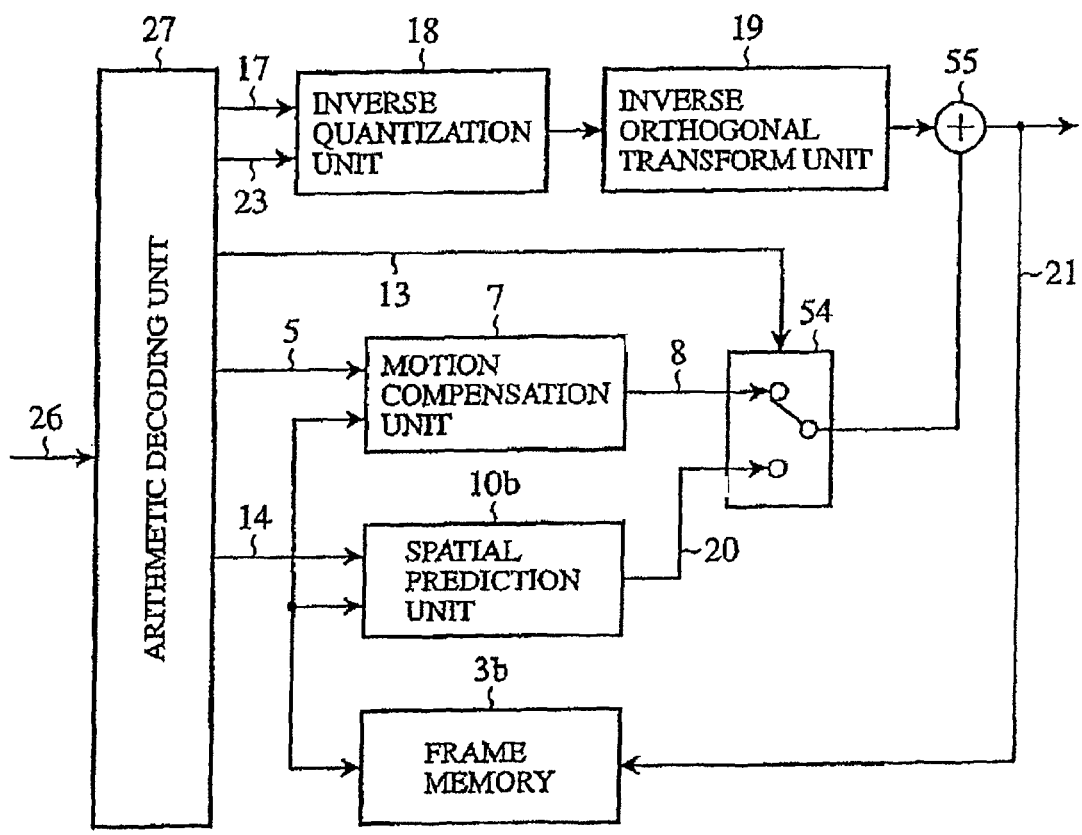
FIG. 4 shows a construction of a video decoding apparatus (digital signal decoding apparatus) according to the first embodiment.

FIG. 4 shows a configuration showing a video decoding apparatus (digital signal decoding apparatus) according to the first embodiment of the present invention. Referring to FIG. 4, an arithmetic coding unit 27 performs entropy decoding so as to restore parameters including the motion vector 5, the coding mode information 13, the spatial prediction mode 14, the orthogonal coefficient data 17 and the quantization step parameter 23. The inverse quantization unit 18 subjects the orthogonal coefficient data 17 and the quantization step parameter 23 restored by the arithmetic decoding unit 27 to inverse quantization. The inverse orthogonal transform unit 19 subjects the orthogonal transform coefficient data 17 and the quantization step parameter 23 thus inverse-quantized to inverse orthogonal transform.

The motion compensation unit 7 restores the temporal predicted image 8 using the motion vector restored by the arithmetic decoding unit 27. A spatial prediction unit 10b restores the spatial predicted image 20 from the spatial prediction mode 14 restored by the arithmetic decoding unit 27.

A switching unit 54 selects for output the temporal predicted image 8 or the spatial predicted image 20 in accordance with the coding mode information 13 restored by the arithmetic decoding unit 27. An adder 55 adds the prediction error signal output from the inverse orthogonal transform unit 19 to the output signal from the switching unit 54 so as to output a decoded image 21. The decoded image 21 is stored in a frame memory 3b so as to be used to generate a predicted image for a frame subsequent to the decoded image 21.

A description will now be given of the operation according to the first embodiment.

First, the operation of the video coding apparatus and the video decoding apparatus will be outlined.

(1) Outline of the Operation of the Video Coding Apparatus

The input image signal 1 is input in units of macroblocks derived from division of individual video frames. The motion estimation unit 2 of the video coding apparatus estimates the motion vector 5 for each macroblock using the reference image 4 stored in the frame memory 3a.

The motion compensation unit 7 constructs the temporal predicted image 8 based on the motion vector 5 when the motion detection unit 2 extracts the motion vector 5.

The subtractor 51 receives the temporal predicted image 8 from the motion compensation unit and determines a difference between the input image signal 1 and the temporal predicted image 8. The subtractor 51 then outputs the difference, the temporal prediction error signal 9, to the coding mode determination unit 12.

The spatial prediction unit 10a refers to the input video signal 1 so as to generate the spatial prediction error signal 11 by making a prediction from spatially neighboring areas in a given video frame.

The coding mode determination unit 12 selects a mode capable of coding a target macroblock most efficiently and outputs the coding mode information to the arithmetic coding unit 6, the mode selected by the code mode determination unit 12 being one of a motion compensation mode for coding the temporal prediction error signal 9, a skip mode for a case where the motion vector 5 is zero and the temporal prediction error signal 9 has a null component, and an intra mode for coding the spatial prediction error signal 11. When selecting the motion prediction mode, the coding mode determination unit 12 outputs the temporal prediction error signal 9 to the orthogonal transform unit 15 as a signal that requires coding. When selecting the intra mode, the coding mode determination unit 12 outputs the spatial prediction error signal 11 to the orthogonal transform unit 15 as a signal that requires coding.

When the motion prediction mode is selected, the motion vector 5 is output from the motion estimation unit 2 to the arithmetic coding unit 6 as information that requires coding. When the intra mode is selected, the intra prediction mode 14 is output from the spatial prediction unit 10a to the arithmetic coding unit 6 as information that requires coding.

The orthogonal transform unit 15 receives the signal that requires coding from the coding mode determination unit 12, subjects the signal to orthogonal transform and outputs the resultant orthogonal transform coefficient data to the quantization unit 16.

The quantization unit 16 receives the orthogonal transform coefficient data from the orthogonal transform unit 15 and quantizes the orthogonal transform coefficient data with a granularity indicated by the quantization parameter 23 determined by the coding controller 22.

By allowing the coding controller 22 to control the quantization step parameter 23, appropriate balance between a coding rate and quality is ensured. Generally, the volume of arithmetically coded data stored in the transmission buffer 24 for transmission is examined at predetermined intervals so that the quantization step parameter 23 is adjusted in accordance with the residual volume 25 of the data that remain in the buffer. For example, when the residual volume is large, the coding rate is controlled to be low and, when the residual volume 25 is relatively small, the coding rate is controlled to be high so that the quality is improved.

The inverse quantization unit 18 receives the orthogonal transform coefficient data 17 from the quantization unit 16 and subjects the orthogonal transform coefficient data 17 to inverse quantization with the granularity indicated by the quantization step parameter 23.

The inverse orthogonal transform unit 19 subjects the orthogonal transform coefficient data subjected to inverse quantization by the inverse quantization unit 18 to inverse orthogonal transform.

The switching unit 52 selects for output the temporal predicted image 8 output from the motion compensation unit 7 or the spatial predicted image 20 output from the spatial prediction unit 10a, in accordance with the coding mode information 13 output from the coding mode determination unit 12. When the coding mode information 13 indicates the motion prediction mode, the switching unit 52 selects for output the temporal predicted image 8 output from the motion compensation unit 7. When the coding mode information 13 indicates the intra mode, the switching unit 52 selects for output the spatial predicted image 20 output from the spatial prediction unit 10a.

The adder 53 adds the output signal from the switching unit 52 to the output signal from the inverse orthogonal transform unit 19 so as to generate the locally decoded image 21. The locally decoded image 21 is stored in the frame memory 3a as the reference image 4 so as to be used for motion prediction for subsequent frames.

The arithmetic coding unit 6 subjects coding data including the motion vector 5, the coding mode information 13, the spatial prediction mode 14 and the orthogonal transform coefficient data 17 to entropy coding according to steps described later and outputs the coding result via the transmission buffer 24 as the compressed video data 26.

(2) Outline of the Operation of the Video Decoding Apparatus

The arithmetic decoding unit 27 receives the compressed video data 26 from the video coding apparatus and subjects the received data to entropy decoding described later, so as to restore the motion vector 5, the coding mode information 13, the spatial prediction mode 14, the orthogonal transform coefficient data 17 and the quantization step parameter 23.

The inverse quantization unit 18 subjects the orthogonal transform coefficient data 17 and the quantization step parameter 23 restored by the arithmetic decoding unit to inverse quantization. The inverse orthogonal transform unit 19 subjects the orthogonal transform coefficient data 17 and the quantization step parameter 23 thus inverse-quantized to inverse orthogonal transform.

When the coding mode information 13 restored by the arithmetic decoding unit 27 indicates the motion prediction mode, the motion compensation unit 7 restores the temporal predicted image 8 using the motion vector 5 restored by the arithmetic decoding unit 27.

When the coding mode information 13 restored by the arithmetic decoding unit 27 indicates the intra mode, the spatial prediction unit 10b restores the spatial predicted image 20 using the spatial prediction mode 14 restored by the arithmetic decoding unit 27.

A difference between the spatial prediction unit 10a of the video coding apparatus and the spatial prediction unit 10b of the video decoding apparatus is that, while the spatial prediction unit 10a is capable of performing a step of most efficiently identifying the spatial prediction mode from a variety of available spatial prediction modes, the spatial prediction unit 10b is limited to generating the spatial predicted image 20 from the spatial prediction mode 14 that is given.

The switching unit 54 selects the temporal predicted image 8 restored by the motion compensation unit 7 or the spatial predicted image 20 restored by the spatial prediction unit 10b, in accordance with the coding mode information 13 restored by the arithmetic decoding unit 27. The switching unit 54 then outputs the selected image to the adder 55 as the predicted image.

The adder 55, receiving the predicted image from the switching unit 54, adds the predicted image to the prediction error signal output from the inverse orthogonal transform unit 19 so as to obtain the decoded image 21.

The decoded image 21 is stored in the frame memory 3b so as to be used to generate predicted images for subsequent frames. A difference between the frame memories 3a and 3b consists in the difference between the video coding apparatus and the video decoding apparatus respectively hosting the memories.

(3) Arithmetic Coding and Decoding

A detailed description will now be given of arithmetic coding and decoding according to the features of the present invention. A coding process is performed by the arithmetic coding unit 6 of FIG. 3 and a decoding process is performed by the arithmetic decoding unit 27 of FIG. 4.

Figure 5:
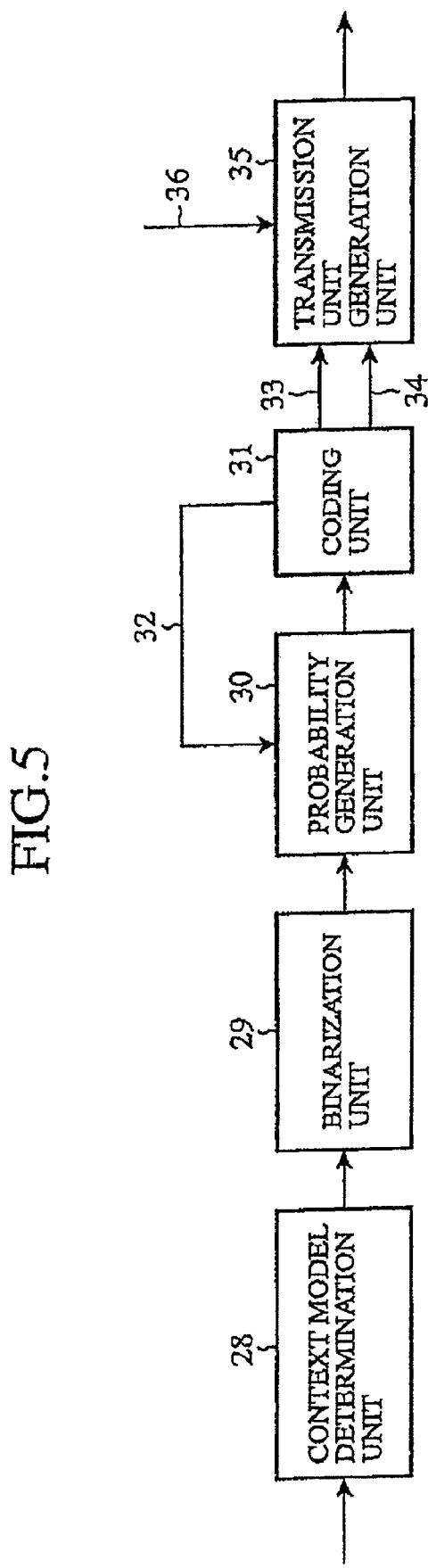
FIG. 5 shows an internal construction of an arithmetic coding unit 6 of FIG. 3.

FIG. 5 shows a construction of the arithmetic coding unit 6 of FIG. 3. Referring to FIG. 5, the arithmetic coding unit 6 comprises a context model determination unit 28, a binarization unit 29, a probability generation unit 30, a coding unit 31 and a transmission unit generation unit 35. The context model determination unit 28 determines a context model (described later) defined for each of individual types of coding data including the motion vector 5, the coding mode information 13, the spatial prediction mode 14 and the orthogonal transform coefficient data 17. The binarization unit 29 converts multilevel data in accordance with a binarization rule determined for each of types of coding data. The probability generation unit 30 assigns a probability of occurrence of binary values (0 or 1) for individual binary sequences after binarization. The coding unit 31 executes arithmetic coding based on the probability thus generated. The transmission unit generation unit 35 indicates the timing when the arithmetic coding should be suspended and constructs data constituting a transmission unit at the timing.

Figure 6:
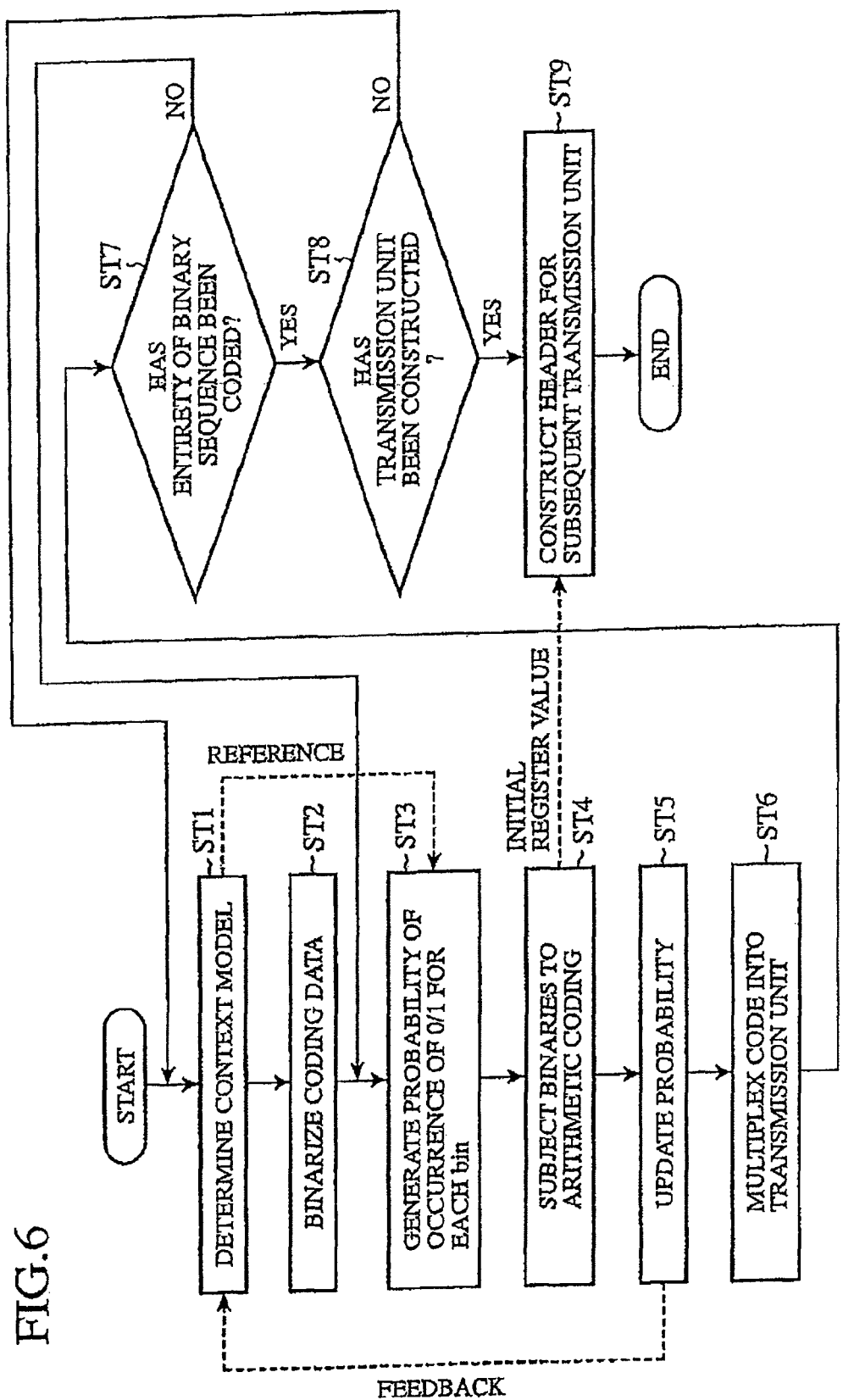
FIG. 6 is a flowchart showing processes performed by the arithmetic coding unit 6 of FIG. 5.

FIG. 6 is a flowchart showing processes performed by the arithmetic coding unit 6 of FIG. 5.

1) Context Mode Determination Process (Step ST1).

A context model is a model that defines dependence of probability of occurrence of data symbols on information that causes variation in the probability. By switching between probability states in accordance with the dependence, it is possible to perform coding adapted to the probability.

Figure 7:
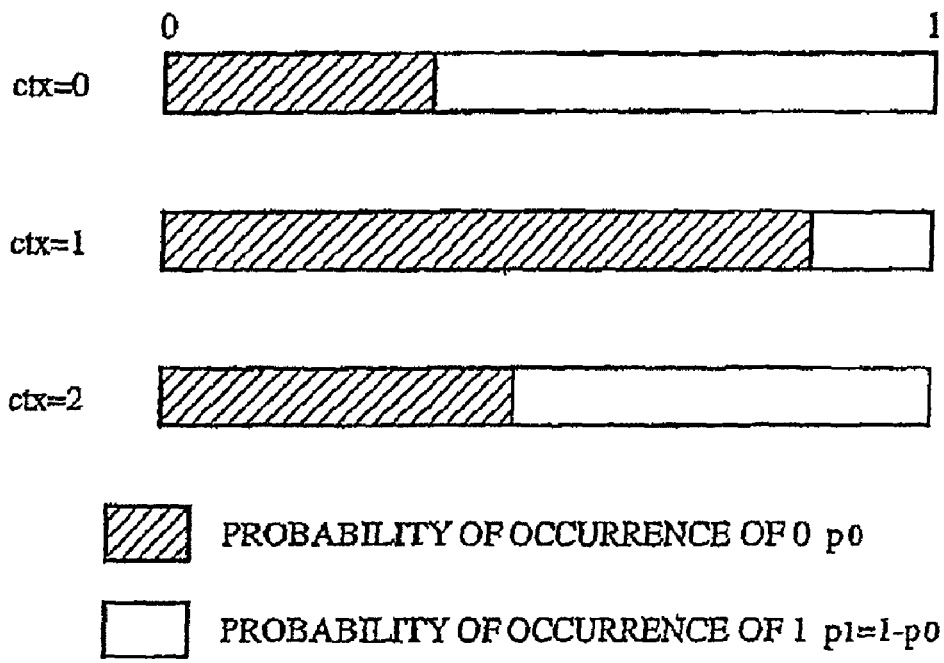
FIG. 7 illustrates a concept of a context model.

FIG. 7 illustrates a concept of context model. In FIG. 7, a binary data symbol is assumed. Options 0-2 available for ctx are defined on an assumption that the probability state of the data symbols to which ctx is applied changes depending on the condition.

In video coding according to the first embodiment, the value for ctx is switched from one to another in accordance with interdependence between coding data for a given macroblock and coding data for a neighboring macroblock.

Figure 8:
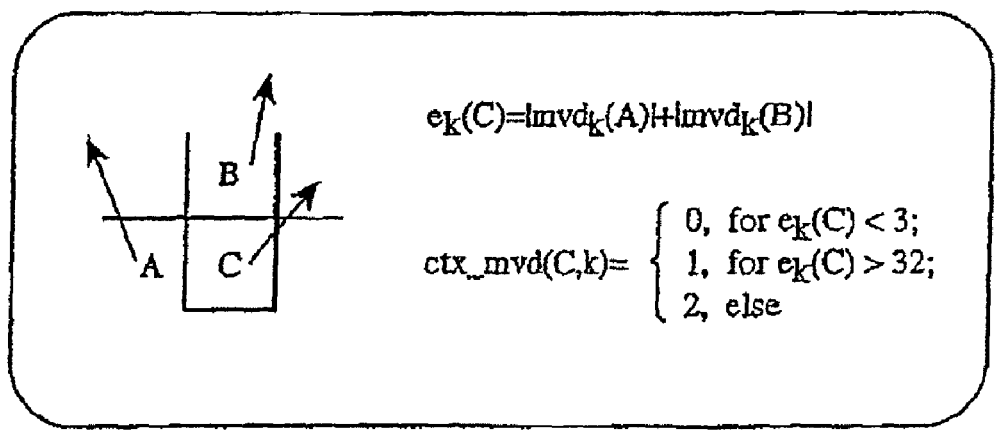
FIG. 8 illustrates an example of context model for a motion vector.

FIG. 8 illustrates an example of context model for a motion vector, the example being taken from D. Marpe et al. "Video Compression Using Context-Based Adaptive Arithmetic Coding", International Conference on Image Processing 2001. The context model here is relevant to a motion vector in a macroblock.

Referring to FIG. 8, for coding of a motion vector for block C, a motion vector prediction error mvdk(c), a difference between the motion vector for block C and a prediction thereof from its spatial neighbors, is coded. ctx_mvd(C, k) indicates a context model.

mvdk(A) indicates a motion vector prediction error for block A and mvdk(B) indicates a motion vector prediction error for block B. mvdk(A) and mvdk(B) are used to define an evaluated value ek(C) evaluated for switching between context models.

The evaluated value ek(C) indicates a variation in motion vectors in the neighbors. Generally, if ek(C) is small, mvdk (C) will have a small magnitude. If ek(C) is large, it is more likely that mvdk(C) will have a large magnitude.

Accordingly, the probability of occurrence of symbols in mvdk(C) should best be optimized based on ek(C). A context model is one of predefined sets of variations of probability estimate. In this case, there are three variation sets of probability estimate.

Aside from the motion vector, context models are defined for coding data including the coding mode information 13, the spatial prediction mode 14 and the orthogonal transform coefficient data 17. The context models are shared by the arithmetic coding unit 6 of the video coding apparatus and the arithmetic decoding unit 27 of the video decoding apparatus. The context model determination unit 28 of the arithmetic coding unit 6 of FIG. 5 selects a model defined for a type of coding data.

Selection, from a context model, a probability estimate variation is described as a probability generation process in 3) below.

2) Binarization Step (Step ST2)

The coding data is turned into a binary sequence by the binarization unit 29 so that a context model is applied to each bin (binary location) of the binary sequence. The rule for binarization is in accordance with the general distribution of values of the coding data. A variable-length binary sequence results. By coding each bin instead of directly subjecting the multilevel coding data to arithmetic coding, the number of divisions on a probability line is reduced so that computation is simplified. Thus, binarization has a merit of simplifying a context model.

3) Probability Generation Process (Step ST3)

As a result of the processes 1) and 2) above, binarization of the multilevel coding data and the setting of a context model applied to each bin are completed. The bins are now ready for coding. Each context model includes variations giving an estimate of the probability for 0/1. The probability generation unit 30 refers to the context model determined in step ST1 so as to generate the probability of occurrence of 0/1 in each bin.

FIG. 8 shows an example of the evaluated value ek(C) for selection of the probability. The probability generation unit 30 determines the evaluated value such as ek(C) shown in FIG. 8 for selection of the probability. The probability determination unit 30 accordingly examines options available in the context model referred to and determines which variation of probability estimate is to be used for coding of a current bin.

4) Coding Process (Steps ST3-ST7)

As a result of the step 3), the probability of occurrence of 0/1 necessary for arithmetic coding is determined and identified on a probability line. Accordingly, the coding unit 31 performs arithmetic coding as described with reference to the related art (step ST4).

The actual coding data 32 (0 or 1) is fed back into the probability generation unit 30. The frequency of occurrence of 0/1 is counted to update the variation of probability estimate in the context model used (step ST5).

For example, it is assumed, that, when a total of 100 bins have been coded using a variation of probability estimate in a given context model, the frequency of occurrence of 0/1 under that variation of probability estimate is 0.25, 0.75. When 1 is subsequently coded using the same variation of probability estimate, the frequency of occurrence of 1 is updated so that the probability of occurrence of 0/1 is updated to 0.247, 0.752. According to this mechanism, efficient coding adapted to the actual probability of occurrence is possible.

An arithmetic code 33 generated by the coding unit 31 from the coding data 32 (0 or 1) is fed to the transmission unit generation unit 35 and multiplexed into data constituting a transmission unit as described in 6) below (step ST6).

A determination is made as to whether the entirety of a binary sequence (bins) of the coding data has been coded (step ST7). If the coding has not been completed, control is returned to step ST3, where probability generation for each bin and subsequent steps are performed. If it is determined that the coding process is completed, a transmission unit generation process described below is performed.

5) Transmission Unit Generation Process (Steps ST8-ST9)

Arithmetic coding turns a plurality of sequences of coding data into a single codeword. A special consideration that should be given to a video signal is that a decoded image should be created in units of frames so that a frame memory is updated. This is because a video signal is characterized by motion prediction between frames and frame-by-frame display. Therefore, it is necessary to identify a boundary between frames in arithmetically compressed data. For the purpose of multiplexing with other media data such as voice/audio and for the purpose of packet transmission, the compressed data for transmission may have to be partitioned into units smaller than a frame. An example of sub-frame unit is known as a slice structure produced by grouping a plurality of macroblocks in raster scan order.

Figure 9:
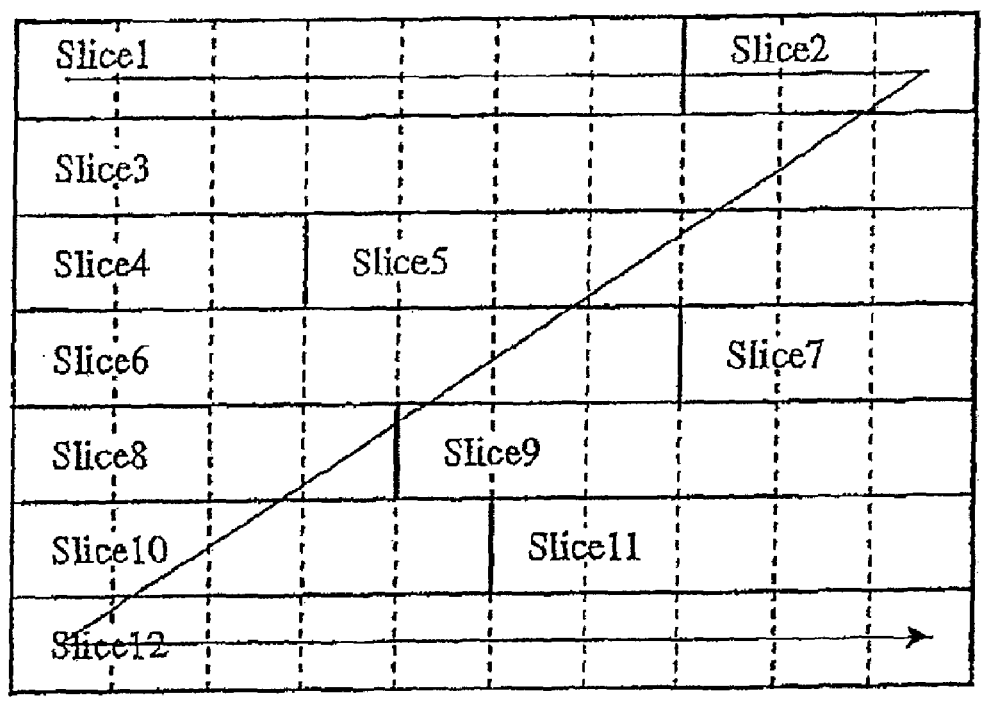
FIG. 9 shows a slice structure.

FIG. 9 illustrates a slice structure.

A macroblock is encircled by dotted lines. Generally, a slice structure is used as a unit for resynchronization in decoding. In a typical example, slice data are mapped onto a payload of a IP transport packet. For real-time IP transmission of media data such as video which is relatively less tolerant of transmission delays, real-time transport protocol (RTP) is often used. An RTP packet has a time stamp attached to its header portion. Slice data for video may be mapped onto a payload portion for transmission. For example, Kikuchi et al. "RTP Payload Format for MPEG-4 Audio/Visual Streams", RFC 3016 describes a method for mapping the MPEG-4 compressed video data onto an RTP payload in units of MPEG-4 slices (video packets).

RTP packets are transmitted as UDP packets, Since UDP does not support retransmission, the entirety of slice data may not reach a decoding apparatus when a packet loss occurs. If the coding of subsequent slice data is conditioned on information of the discarded slice, appropriate decoding is not possible even if the subsequent slice data arrive at the decoding apparatus normally.

For this reason, it is necessary to ensure that any given slice is properly decoded in its entirety without resorting to any interdependence. For example, it should be ensured that Slice 5 is coded without using information of macroblocks located in Slice 3 above or Slice 4 below.

For improvement of arithmetic coding efficiency, however, it is desirable to adapt the probability of occurrence of symbols to surrounding conditions or to maintain the process of dividing a probability line. To code Slice 4 and Slice 5 independent of each other, for example, a register value representing a codeword of arithmetic coding are not maintained when arithmetic coding of the last macroblock in Slice 4 is completed. For Slice 5, the register is reset to an initial state so that coding is restarted. In this way, it is impossible to exploit correlation that exits between the end of Slice 4 and the head of Slice 5, resulting in a lower coding efficiency. Thus, a general practice in the design is that resilience to unexpected loss of slice data due to transmission errors is improved at the cost of a decrease in the coding efficiency.

The transmission unit generation unit 35 according to the first embodiment provides a method and an apparatus for improving the adaptability of the design. More specifically, where the possibility of loss of slice data due to transmission errors is extremely low, interdependence between slices is not disregarded but is fully exploited.

When the possibility of loss of slice data is high, interdependence between slices may be disregarded so that the coding efficiency is adaptively controlled in units of transmission.

The transmission unit generation unit 35 according to the first embodiment receives a transmission unit designation signal 36 at the end of a transmission unit. The transmission unit designation signal 36 is provided as a control signal in the video coding apparatus. The transmission unit generation unit 35 generates transmission units by partitioning the codeword of the arithmetic code 33 received from the arithmetic coding unit 31 in accordance with the timing of the input of the transmission unit designation signal 36.

More specifically, the transmission unit generation unit 35 multiplexes the arithmetic code derived from the coding data 32 sequentially into bits that constitute the transmission unit (step ST6). The transmission unit generation unit determines whether coding of data for macroblocks that fit into a transmission unit has been completed, by referring to the transmission unit designation signal 36 (step ST8). When it is determined that coding to build the entirety of a transmission unit has not been completed, control is returned to step ST1 so that the determination of a context model and subsequent steps are performed.

When it is determined that the coding to build the entirety of a transmission unit is complete, the transmission unit generation unit 35 constructs a header for the subsequent transmission unit as described below (step ST9).

1. The unit 35 provides a register reset flag indicating whether a register value, which designates a probability line segmentation status, i.e. an arithmetic coding process for codeword representation, should be reset in the next transmission unit. In the initially generated transmission unit, the register reset flag is set to indicate that the register should be reset.

2. The unit 35 provides an initial register value, which indicates a register value to be used to start arithmetic coding/decoding to build/decompose the next transmission unit, only when the register reset flag indicates that the register should not be reset. As shown in FIG. 5, the initial register value is provided as an initial register value 34 fed from the coding unit 31 to the transmission unit generation unit 35.

Figure 10:
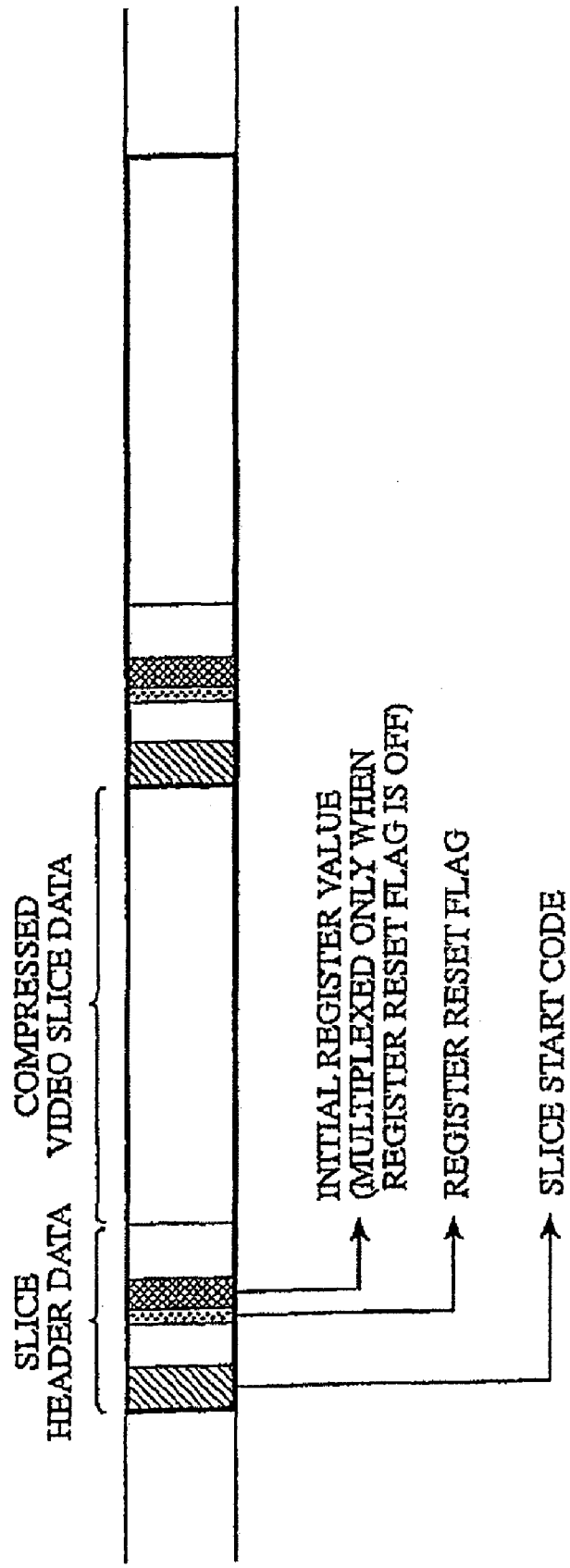
FIG. 10 shows an example of bit stream generated by the arithmetic coding unit 6.

FIG. 10 illustrates a bit stream generated by the arithmetic coding unit 6.

As shown in FIG. 10, slide header data for compressed video slice data includes a slice start code, the register reset flag described in above, the initial register value multiplexed into the bit stream only when the register reset flag indicates that the register should not be reset.

With the added information described above, slice-to-slice continuity for arithmetic coding is maintained even when loss of the preceding slice occurs, by using the register reset flag and the initial register value included in the current slice header data. Accordingly, the coding efficiency is prevented from becoming low.

Figure 11:
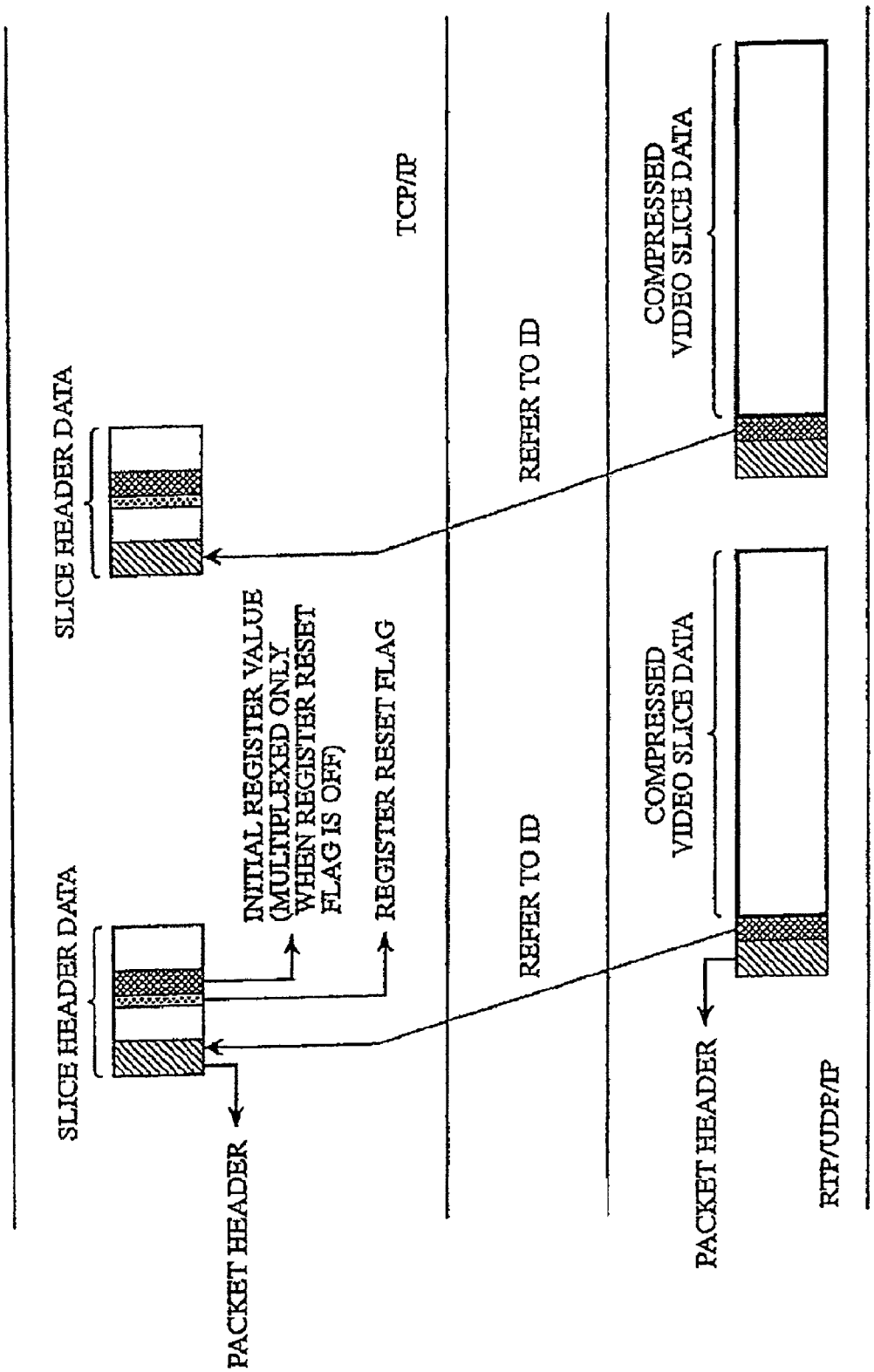
FIG. 11 shows another example of bit stream generated by the arithmetic coding unit 6.

FIG. 10 shows the slice header data and the compressed video slice data being multiplexed into the same bit stream. Alternatively, as shown in FIG. 11, the slice header data may be carried in a separate bit stream for offline transmission and the compressed video slice data may have attached thereto ID information referring to the corresponding slice header data. Referring to FIG. 11, the stream is transmitted in accordance with the IP protocol. The header data is transmitted using TCP/IP that provides relatively high reliability. The compressed video data is transmitted using RTP/UDP/IP characterized by small delays. In accordance with the separate transmission scheme of FIG. 11 for transmission of headers and transmission units, the data transmitted using RTP/UDP/IP need not be partitioned into slices.

Use of slices basically requires resetting of interdependence (context model) between a video signal for a given slice and signals for neighboring areas to ensure that decoding for a slice can be resumed independent of the other slices. This will bring about a drop in video coding efficiency.

Once it is ensured, however, that the initial register status is transmitted over TCP/IP, as shown in FIG. 11, video signals may be coded by fully exploiting the available context models in a frame. Resultant arithmetically coded data may be partitioned for transmission prior to RTP packetization. According to this separate transmission scheme, the fruit of arithmetic coding processes is consistently obtained without being affected by the conditions occurring in a circuit. Therefore, a bit stream produced without the constraints of the slice structure can be transmitted, while ensuring a relatively high degree of resilience to errors.

Figure 12:
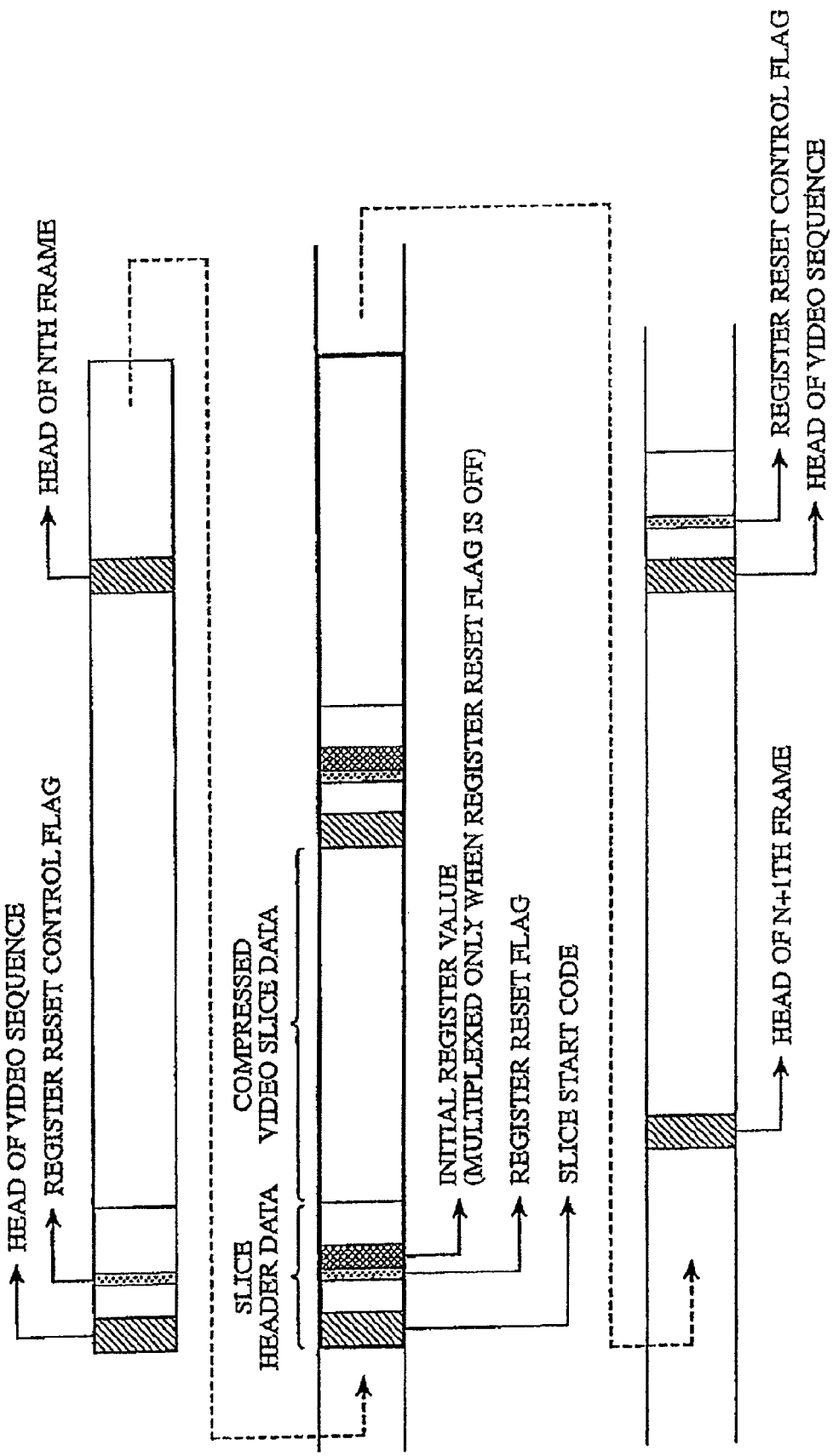
FIG. 12 shows another example of bit stream generated by the arithmetic coding unit 6.

In an alternative approach shown in FIG. 12, a layer above may be used to indicate whether a syntax comprising the register reset flag and the initial register value is to be used. FIG. 12 shows a register reset control flag, indicating whether a syntax comprising the register reset flag and the initial register value is to be used, being multiplexed into a header attached to a video sequence comprising a plurality of video frames.

For example, when it is determined that the circuit quality is low and stable video transmission may be possible by consistently resetting registers throughout a video sequence, the register reset control flag is set to indicate that the register is always reset at the head of a slice throughout the video sequence. In this case, the register reset flag and the initial register value need not be multiplexed on a slice-by-slice level.

By controlling register resetting on a video sequence level, overhead information otherwise transmitted for each slice is reduced in size when, for example, a specified circuit condition (for example, a specified error rate in a circuit) persists. The register reset control flag may of course be attached to a header of any desired video frame (Nth frame, N+1th frame) in a video sequence.

Figure 13:
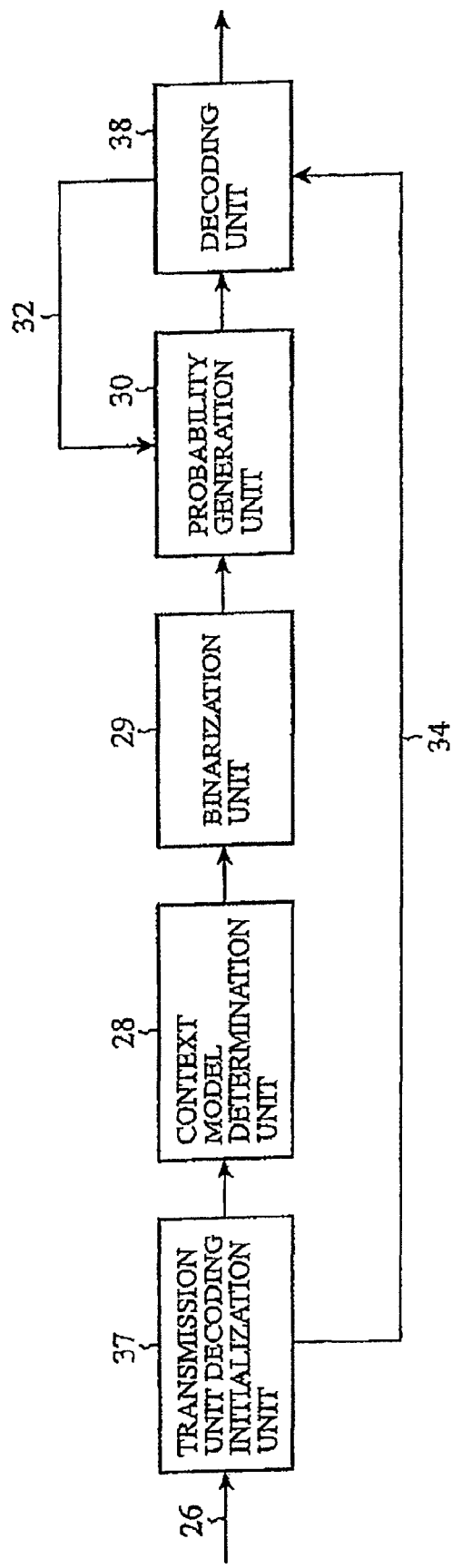
FIG. 13 shows an internal construction of an arithmetic decoding unit 27 of FIG. 4.

FIG. 13 shows an internal construction of the arithmetic decoding unit 27 of FIG. 4.

The arithmetic decoding unit 27 comprises a transmission unit decoding initialization unit 37, a context model determination unit 28, a binarization unit 29, a probability generation unit and a decoding unit 38. The transmission unit decoding initialization unit 37 initializes, for a transmission unit received, an arithmetic decoding process, based on added information related to an arithmetic coding and included in a header. The context model determination unit 28 identifies the type of data, i.e. identifying whether the motion vector 5, the coding mode information 13, the spatial prediction mode 14 or the orthogonal transform coefficient data 17 is to be restored by decoding, so as to determine a context model, shared by the video coding apparatus and the video decoding apparatus, for the identified type. The binarization unit 29 generates a binarization rule defined for the identified decoding data type. The probability generation unit 30 gives the probability of occurrence of each bin (0 or 1) in accordance with the binarization rule and the context model. The decoding unit 38 performs arithmetic decoding based on the probability thus generated so as to restore the motion vector 5, the coding mode information 13, the spatial prediction mode 14 and the orthogonal transform coefficient data 17 in accordance with the binary sequence resulting from arithmetic decoding and the binarization rule.

Figure 14:
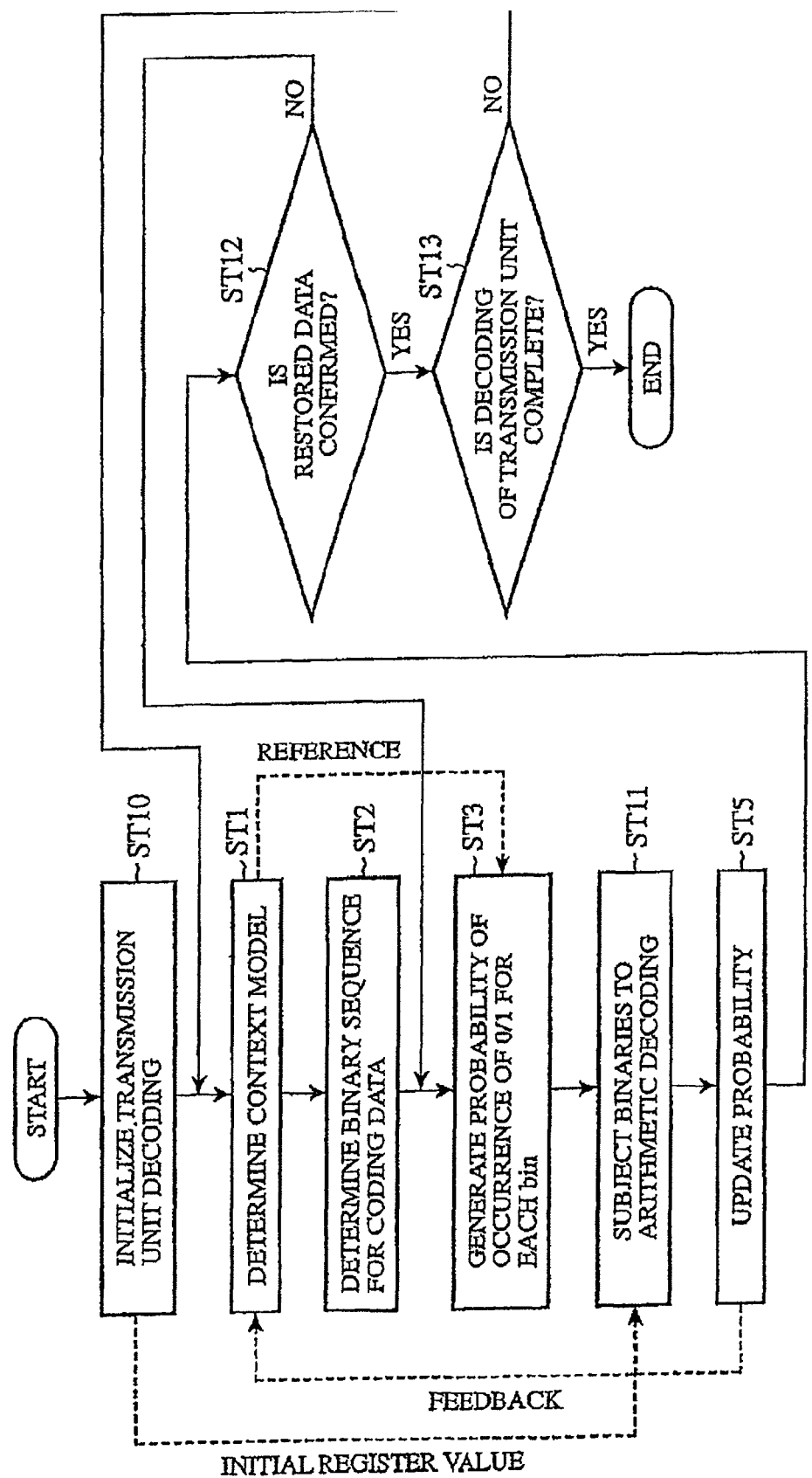
FIG. 14 is a flowchart of processes performed by the arithmetic decoding unit 27 of FIG. 13.

FIG. 14 is a flowchart showing a process performed by the arithmetic decoding unit 27 of FIG. 13.

6) Transmission Unit Decoding Initialization Process (Step ST10)

As shown in FIG. 10, the status in the decoding unit 38 is initialized before arithmetic decoding is started, based on the register reset flag and the initial register value 34 multiplexed into each transmission unit such as a slice (step ST10), the register reset flag designating whether the register value indicating the arithmetic coding process is reset or not. When the register value is reset, the initial register value 34 is not used.

7) Context Model Determination Process, Binarization Process and Probability Generation Process These processes are performed by the context model determination unit 28, the binarization unit 29 and the probability generation unit 30 shown in FIG. 13. These processes are identified as steps ST1-ST3, respectively, in the flowchart and the description thereof is omitted since they are similar to the context model determination process ST1 identified as the process 1), the binarization process ST2 identified as the process 2) and the probability generation process ST3 identified as the process 3) in the video coding apparatus.

8) Arithmetic Decoding Process (Step ST11)

The probability of occurrence of bin to be restored is identified through the processes 1)-7). The decoding unit 38 restores the value of bin (step ST11), in accordance with the arithmetic decoding process described with reference to the related art. In a similar configuration as the video coding apparatus, the decoding unit 38 counts the frequency of occurrence of 0/1 so as to update the probability of occurrence of bin (step ST5). The decoding unit 38 further confirms the value of bin restored by comparing it with a binary series pattern defined by the binarization rule (step ST12).

If the value of bin restored is not confirmed as a result of comparison with the binary series pattern defined by the binarization rule, the process identified as step ST3 for generating the probability for 0/1 of each bin and the subsequent processes are performed for a second time (steps ST3, ST11, ST5, ST12).

If the value of bin restored is confirmed by successfully matching it with the binary series pattern defined by the binarization rule, the data indicated by the matching pattern are output as the restored data. If the decoding is not complete for the entirety of transmission unit such as a slice (step ST13), the context model determination process of step ST1 and the subsequent processes are performed repeatedly until the entirety of transmission unit is decoded.

As has been described, according to the first embodiment, for transmission of compressed video data in transmission units such as slices, the slice header data has the register flag and the initial register value 34 attached thereto, the register reset flag designating whether the register value indicating the arithmetic coding process is reset or not. Accordingly, it is possible to perform coding without losing the continuity of the arithmetic coding process. The coding efficiency is maintained, while the resilience to transmission errors is improved. Decoding of resultant codes is also possible.

In the first embodiment, a slice structure is assumed as a transmission unit. Alternatively, the present invention is equally applicable to a configuration in which a video frame is a transmission unit.

Second Embodiment

An alternative configuration of the arithmetic coding unit 6 and the arithmetic decoding unit 27 according to the second embodiment will now be described. In the second embodiment, not only the register value indicating the status of a codeword from the arithmetic coding process but also the status of learning of a variation of probability estimate in a context model is multiplexed into the slice header. The status of learning occurs in the probability generation unit 30 as the unit updates the probability of occurrence of each bin.

For example, referring to FIG. 8 in the first embodiment, in order to improve the arithmetic coding efficiency for block C, information on the motion vector for block B above block C is exploited to determine a variation of probability estimate. Accordingly, if block C and block B are located in difference slices, the information on block B should be prevented from being used to determine the probability of occurrence.

This means that the coding efficiency is lowered in a design where the probability of occurrence is adaptively determined using a context model.

Accordingly, the second embodiment provides a method and an apparatus for improving the adaptability of the design. The coding efficiency with which the transmission unit is coded is adaptively controlled such that the slice-to-slice interdependence in respect of arithmetic coding is be disregarded but fully exploited in a case where the probability of loss of slice data due to transmission errors is extremely low and the slice-to-slice interdependence may be disregarded in a case where the probability of loss of slice data is high.

Figure 15:
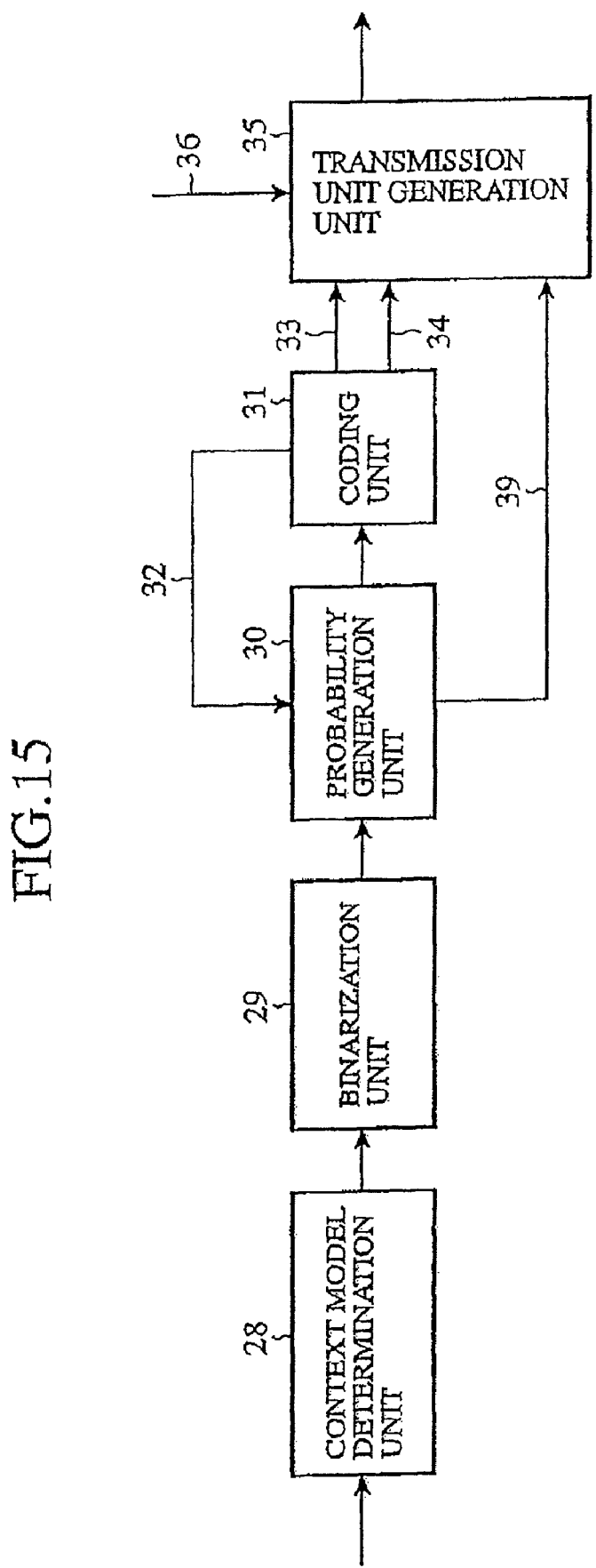
FIG. 15 shows an internal construction of the arithmetic coding unit 6 according to a second embodiment of the present invention.

FIG. 15 shows an internal construction of the arithmetic coding unit 6 according to the second embodiment.

A difference between the arithmetic coding unit 6 according to the second embodiment and the arithmetic coding unit 6 shown in FIG. 5 according to the first embodiment is that the probability generation unit 30 delivers a context model status to be multiplexed into a slice header to the transmission unit generation unit 35.

Figure 16:
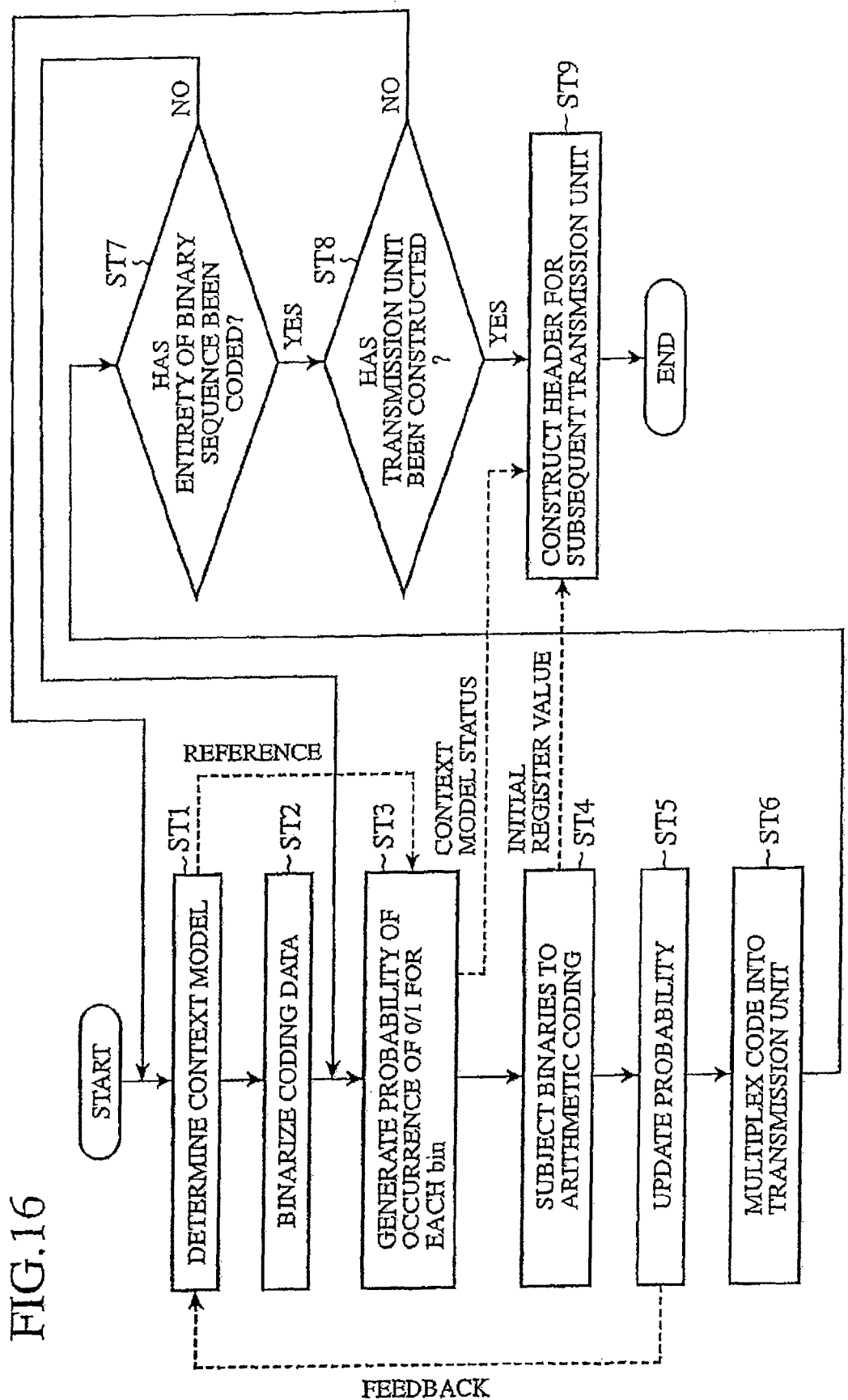
FIG. 16 is a flowchart showing processes performed by the arithmetic coding unit 6 of FIG. 15.

FIG. 16 is a flowchart showing the process performed by the arithmetic coding unit 6 of FIG. 15.

An immediately appreciable difference from the flowchart of FIG. 6 according to the first embodiment is that the context model status 39 that occurs in the process of step ST3 for generating the probability of occurrence of 0/1 for each bin, i.e. the learning status 39 that occurs in the probability generation unit 30 as it updates the variation of probability estimate in a context model, is multiplexed into the slice header in the header construction process (step ST9) in the transmission unit generation unit 35 for constructing a header for the next transmission unit, in a similar configuration as the register value that occurs in the binary arithmetic coding process of step ST4.

Figure 17:
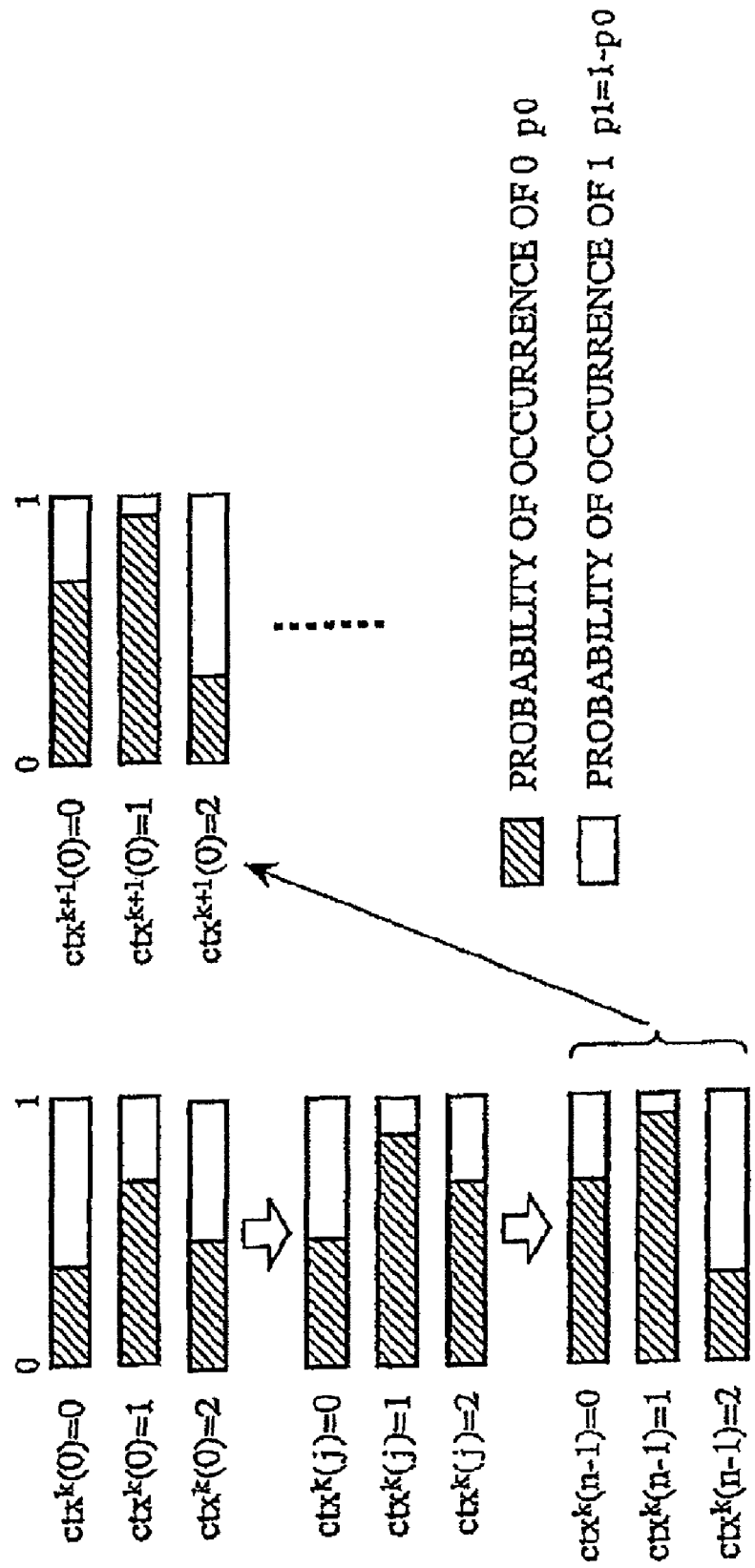
FIG. 17 illustrates a context model learning status.

FIG. 17 illustrates a context model learning status. A description will be given of the meaning of the context model learning status 39 using FIG. 17.

FIG. 17 shows a case where there are a total of n macroblocks in a kth transmission unit. A context model ctx used only once is defined for each macroblock and the probability in ctx varies macroblock to macroblock.

Figure 18:
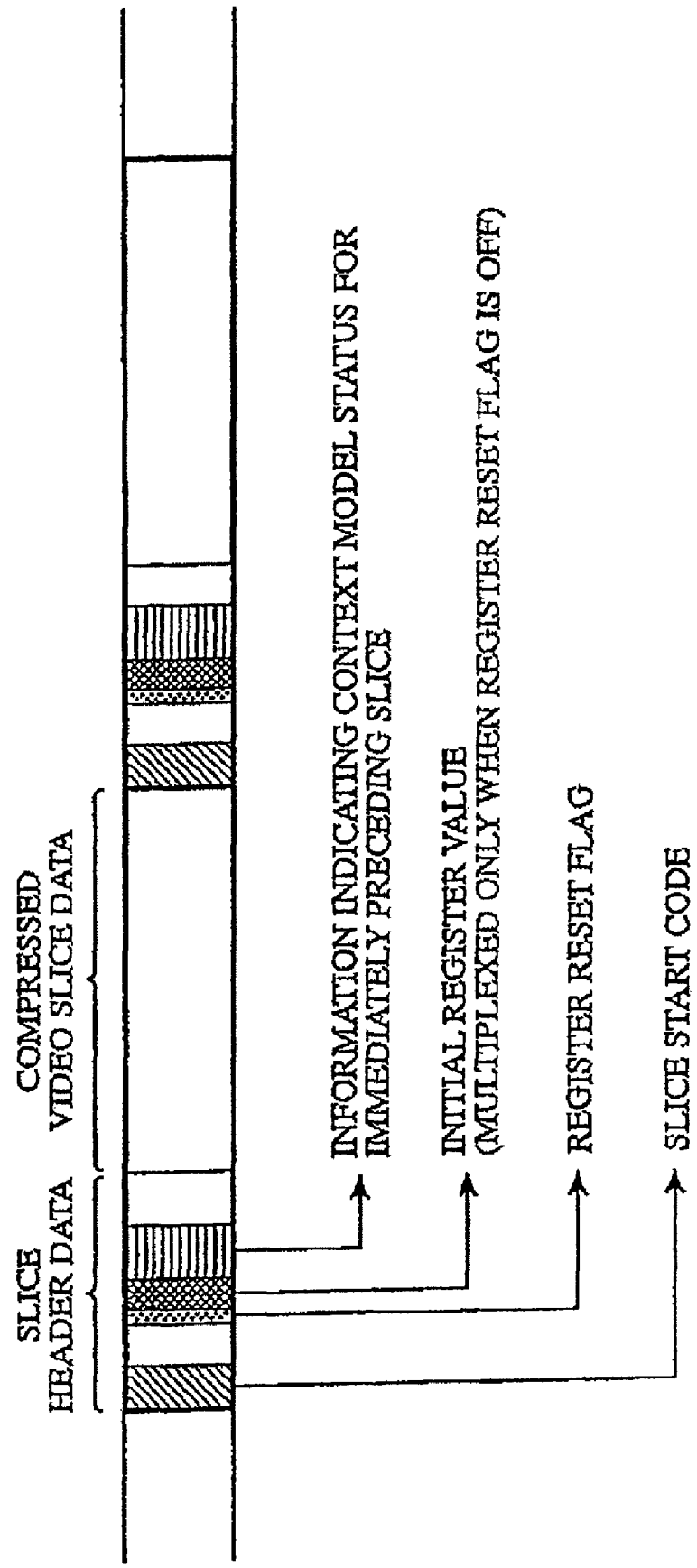
FIG. 18 shows an example of bit stream generated by the arithmetic coding unit 6 according to the second embodiment.

The context model status 39 is inherited from a transmission unit to the next transmission unit. This means that the final status $ctx^k(n-1)$ for the kth transmission unit is made to be equal to the initial status of ctx in the k+1th transmission unit, i.e. the probability p0, p1 of occurrence of 0, 1 in $ctx^{k+1}(n-1)=0, 1, 2$ is made to be equal to the probability po, p of occurrence of 0, 1 in $ctx^k(n-1)$. The transmission unit generation unit 35 transmits data indicating the status of $ctx^k(n-1)$ in the header of the k+1th transmission unit. FIG. 18 illustrates a bit stream generated by the arithmetic coding unit 6 according to the second embodiment.

In the second embodiment, the slice header for the compressed video slice data has information indicating the context model status of the preceding slice attached thereto, in addition to the slice start code, the register reset flag and the initial register value according to the first embodiment shown in FIG. 10.

In an alternative configuration of the second embodiment, the register reset flag may include an indication of whether the context model status is multiplexed or not, in addition to an indication of whether the initial register value is multiplexed or not.

A flag other than the register reset flag may indicate whether the context model status is multiplexed or not.

FIG. 18 shows the slice header data and the compressed video slice data being multiplexed into the same bit stream. Alternatively, as is described in the first embodiment, the slice header data may be carried in a separate bit stream for offline transmission and the compressed data may have attached thereto ID information referring to the corresponding slice header data.

Figure 19:
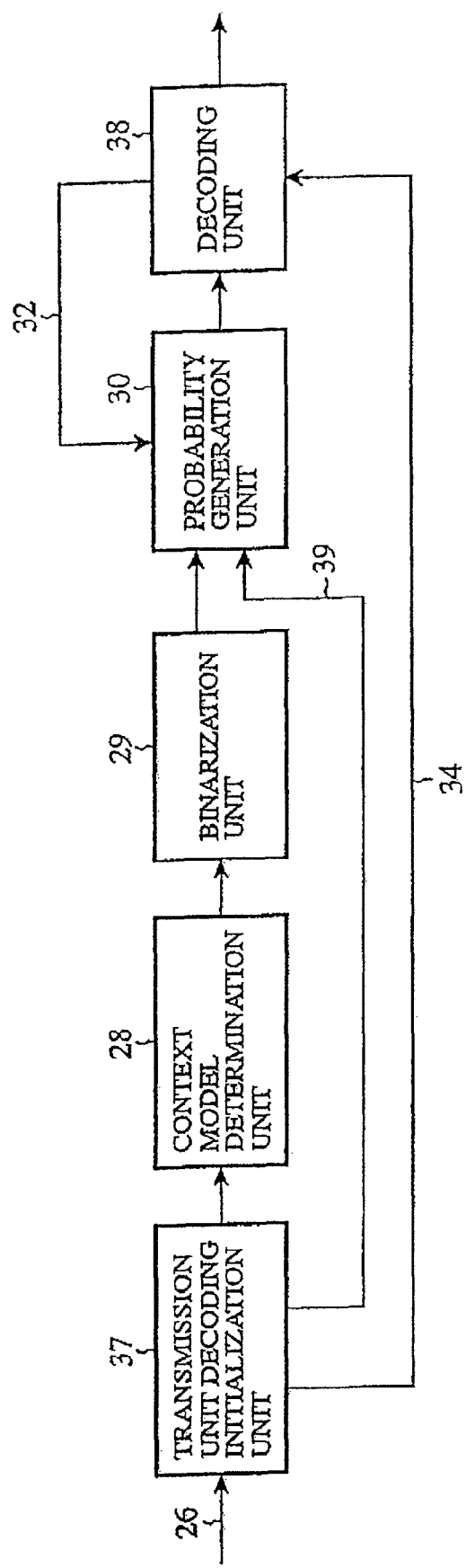
FIG. 19 shows an internal construction of the arithmetic decoding unit 27 according to the second embodiment.

FIG. 19 shows an internal construction of the arithmetic decoding unit 27 according to the second embodiment. A difference between the arithmetic decoding unit 27 according to the second embodiment and the arithmetic decoding unit 27 according to the first embodiment shown in FIG. 13 is that the transmission unit decoding initialization unit 37 of the arithmetic decoding unit 27 according to the second embodiment delivers the context model status for the immediately preceding slice multiplexed into the header to the probability generation unit so that the context model status is inherited from the immediately preceding slice.

Figure 20:
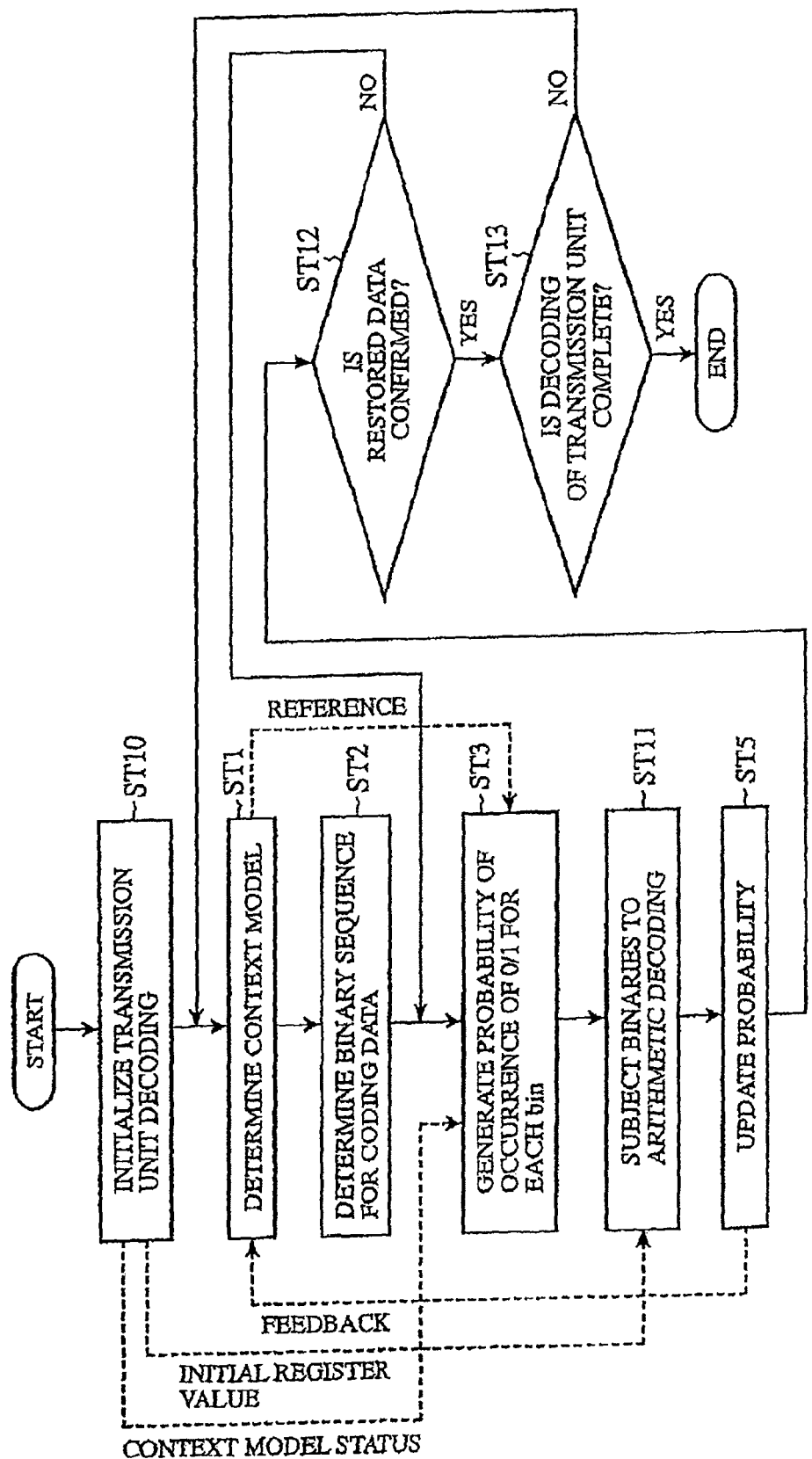
FIG. 20 is a flowchart showing processes performed by the arithmetic decoding unit 27 of FIG. 19.

FIG. 20 is a flowchart showing a process performed by the arithmetic decoding unit 27 of FIG. 19.

A difference between the flowchart of FIG. 20 and that of FIG. 14 is that, in step ST10 for transmission unit decoding initialization, the context model status 39 restored from the slice header is output to the process of step ST3 for generating the probability of occurrence of 0/1 for each bin by referring to the context model determined in step ST1. The context model status 39 output to step ST3 is used to generate the probability of occurrence of 0/1 in the probability generation unit 30.

If the number of context models is extremely large, carrying of the context model status in the slice header introduces an overhead caused by slice headers. In this case, context models providing significant contribution to the coding efficiency may be selected so that the associated status is multiplexed.

For example, motion vectors and orthogonal transform coefficient data represent a large portion in the entire coding volume so that the status may be inherited for these context models only. The type of context model for which the status is inherited may be explicitly multiplexed into a bit stream so that the status may be selectively inherited for important context models depending on the local condition that occurs in video.

As has been described, according to the second embodiment, for transmission of compressed video data in transmission units, the slice header data has the register flag, the initial register value and the context model status information attached thereto, the initial register flag designating whether the register value indicating the arithmetic coding process is reset or not, and the context model status information indicating the context model status of the immediately preceding slice. Accordingly, it is possible to perform coding without losing the continuity of the arithmetic coding process. The coding efficiency is maintained, while the resilience to transmission errors is improved.

In the second embodiment, a slice structure is assumed as a transmission unit. Alternatively, the present invention is equally applicable to a configuration in which a video frame is a transmission unit.

In the second embodiment, information indicating the context model status of the immediately preceding slice is attached to a current header. Therefore, referring to FIG. 8, even when block C and block B immediately preceding block C are located in different slices, the coding efficiency is improved through probability adaptation using context models, by exploiting the context model status of block B in determining the probability for block C. The coding efficiency with which the transmission unit is coded is adaptively controlled such that the slice-to-slice interdependence is not disregarded but the context model status for the immediately preceding slice is fully exploited in a case where the probability of loss of slide data due to transmission errors is extremely low. The context model status for the immediately preceding slice is not used and the slice-to-slice interdependence is disregarded in a case where the probability of loss of slice data is high.

Referring to the bit stream syntax shown in FIG. 18, the second embodiment has been described assuming that information indicating the context model status for data in the immediately preceding slice is attached in each slice header in addition to the register reset flag and the initial register value according to the first embodiment. Alternatively, the register reset flag and the initial register value according to the first embodiment may be omitted so that only the information indicating the context model status for data in the immediately preceding slice is attached in each slice header. Alternatively, the context model status reset flag (see FIG. 21) may be provided irrespective of whether the register reset flag and the initial register value according to the first embodiment are provided, so that only when the context model status reset flag is off, i.e. the context model status is not reset, the information indicating the context model status for data in the immediately preceding slice is attached for use in decoding.

Third Embodiment

A disclosure will now be given of the third embodiment in which transmission units are constructed according to a data partitioning format in which coding data are grouped according to a data type.

The example explained below is taken from Working Draft Number 2, Revision 3, JVT-B118r3 for a video coding scheme discussed in Joint Video Team (JVT) of ISO/IEC MPEG and ITU-T VCEG. The draft discloses as many data items of a specific type as there are macroblocks in a slice structure as shown in FIG. 9, are grouped. The resultant data unit is transmitted in the form of slice data. The slice data (data unit) constructed by grouping is of one of data types 0-7 such as those shown below, for example.

0 TYPE_HEADER picture (frame) or slice header
1 TYPE_MBHEADER macroblock header information (coding mode information)
2 TYPE_MVD motion vector
3 TYPE_CBP CBP (non-zero orthogonal transform coefficient pattern in macroblock)
4 TYPE_2×2DC orthogonal transform coefficient data (1)
5 TYPE_COEFF_Y orthogonal transform coefficient data (2)
6 TYPE_COEFF_C orthogonal transform coefficient data (3)
7 TYPE_EOS end of stream identification information For example, a slice of data type 2 or TYPE_MVD is transmitted as slice data in which are collected as many motion vector information items as there are macroblocks fitting into a slice.

Accordingly, when the k+1th slice of a type TYPE_MVD is subject to decoding following the kth slice of a type TYPE_MVD, only the context model status for motion vectors occurring at the end of the kth slice should be multiplexed into a header of the k+1th slice carrying the TYPE_MVD data, in order to allow the context model learning status for arithmetic coding of motion vectors to be inherited.

Figure 21:
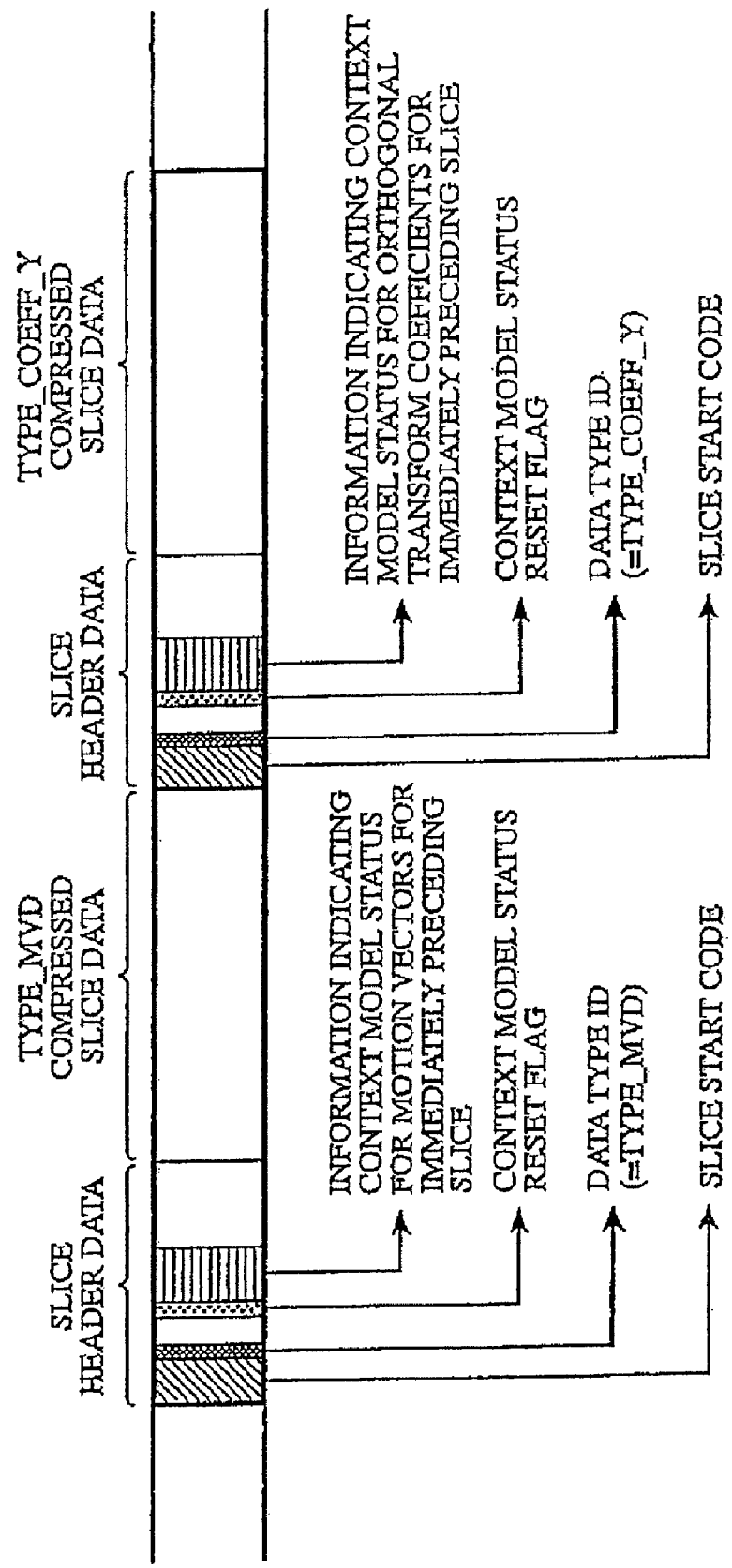
FIG. 21 shows an example of bit stream generated by the arithmetic coding unit 6 according to a third embodiment of the present invention.

FIG. 21 shows an example of bit stream generated by the arithmetic coding unit 6 according to the third embodiment. Referring to FIG. 21, when motion vectors are collected to construct slice data of a data type 2 or TYPE_MVD, the slice header has attached thereto a slice start code, a data type ID designating TYPE_MVD, a context model status reset flag and information indicating the context model status for motion vectors occurring in the immediately preceding slice.

When only orthogonal transform coefficient data (2) of a data type 5 or TYPE_COEFF_Y are collected to construct slice data, the slice header has attached thereto a slice start code, a data type ID designating TYPE_COEFF_Y, a context model status reset flag and information indicating the context model status for orthogonal transform coefficient data occurring in the immediately preceding slice.

FIG. 21 shows the slice header data and the compressed data being multiplexed into the same bit stream. Alternatively, the slice header data may be carried in a separate bit stream for offline transmission and the compressed data may have attached thereto ID information referring to the corresponding slice header data.

Referring to FIG. 15, the arithmetic coding unit 6 according to the third embodiment is implemented such that the transmission unit generation unit 35 reconstructs macroblock data in a slice in accordance with the data partitioning rule described above, so that the ID information designating the data type and the context model learning status corresponding to the data type are collected in slice data.

Referring to FIG. 19, the arithmetic decoding unit 27 according to the third embodiment is implemented such that, for arithmetic decoding, a context model to be used is determined by allowing the transmission unit decoding initialization unit to notify the context model determination unit of the data type ID multiplexed into the slice header, and the context model learning status 39 is inherited across bounds of slices by allowing the transmission decoding initialization unit 37 to notify the probability generation unit 30 of the context model learning status.

As has been described, according to the third embodiment, a video signal is subject to compression coding by being divided into transmission units grouped according to predetermined data types. The video signal belonging to the transmission unit is arithmetically coded such that coding is continued across bounds of transmission units by inheriting, instead of resetting, the symbol occurrence probability learning status from the earlier transmission unit also grouped according to the data type. Accordingly, a high degree of error resilience is ensured and the coding efficiency of arithmetic coding is improved in a configuration in which data are grouped according to predetermined data types.

While the third embodiment assumes that slice structures are organized according to a data type as a transmission unit, video frames may also be organized according to a data type.

In the example of bit stream syntax according to the third embodiment shown in FIG. 21, it is assumed that the header of slice data for a given data type has attached thereto a context model status reset flag and information indicating the context model status of data in the immediately preceding slice when the flag is off. Alternatively, in a similar configuration as the bit stream syntax according to the second embodiment shown in FIG. 18, the header of slice data for a given data type may have attached thereto a context model status reset flag and information indicating the context model status of data in the immediately preceding slice when the flag is off, in addition to the register reset flag and the initial register value. Alternatively, the context model status reset flag may be omitted so that the information indicating the context model status of data in the immediately preceding slice is always attached for use in decoding, irrespective of whether the register reset flag and the initial register value are provided.

In the first through third embodiments, video data is given as an example of digital signals. The present invention is equally applicable to digital signals for audio, digital signals for sill pictures, digital signals for texts and multimedia digital signals in which these are mixed.

In the first and second embodiments, a slice is given as an example of digital signal transmission unit. In the third embodiment, a transmission unit, constructed according to data partitioning for collecting data in a slice according to a data type, is given as an example. Alternatively, an image (picture) constructed from a plurality of slices, i.e. a video frame, may be a transmission unit. The present invention also finds an application in a storage system. In this case, a storage unit, instead of a transmission unit may be constructed.

INDUSTRIAL APPLICABILITY

As has been described, a digital signal coding apparatus according to the present invention is suitably used for transmission of a compressed video signal in which a high degree of error resiliency is ensured and the coding efficiency for arithmetic coding is improved.

The invention claimed is:

1. A digital decoding apparatus for receiving and decoding a compression-coded digital signal in predetermined transmission units, comprising:
   initialization unit for initializing an arithmetic decoding process based on information of initializing a table of probability of occurrence which is multiplexed on a header of data for said predetermined transmission units and information of initializing a register value which shows the arithmetic decoding process;
   a context model determination unit for determining a context model to be used for each type of decoded data among a plurality of context models;
   a binarization unit for generating a binarization rule defined based on the type of decoded data;
   a probability of occurrence generation unit for providing a probability of occurrence corresponding to the context model determined by the binarization rule; and an arithmetic decoding unit for arithmetic decoding based on said generated probability of occurrence and said initialized register value.

2. A digital decoding method for receiving and decoding a compression-coded digital signal in predetermined transmission units, comprising:
   initialization step for initializing an arithmetic decoding process based on information of initializing a table of probability of occurrence which is multiplexed on a header of data for said predetermined transmission units and information of initializing a register value which shows the arithmetic decoding process;
   a context model determination step for determining a context model to be used for each type of decoded data among a plurality of context models;
   a binarization step for generating a binarization rule defined based on the type of decoded data;
   a probability of occurrence generation step for providing a probability of occurrence corresponding to the context model determined by the binarization rule; and
   an arithmetic decoding step for arithmetic decoding based on said generated probability of occurrence and said initialized register value.

3. A digital decoding apparatus for receiving and decoding a compression-coded digital signal in predetermined transmission units, comprising:
   initialization unit for initializing an arithmetic decoding process based on information of initializing a table of probability of occurrence which is multiplexed on a header of data for said predetermined transmission units and information of initializing a register value which shows the arithmetic decoding process;
   a context model determination unit for determining a context model to be used for each type of decoded data among a plurality of context models, which the context model is mutually determined by a context model used by an arithmetic coding process;
   a binarization unit for generating a binarization rule defined based on the type of decoded data;
   a probability of occurrence generation unit for providing a probability of occurrence corresponding to the context model determined by the binarization rule; and
   an arithmetic decoding unit for arithmetic decoding based on said generated probability of occurrence and said initialized register value.

4. A digital decoding method for receiving and decoding a compression-coded digital signal in predetermined transmission units, comprising:
   initialization step for initializing an arithmetic decoding process based on information of initializing a table of probability of occurrence which is multiplexed on a header of data for said predetermined transmission units and information of initializing a register value which shows the arithmetic decoding process;
   a context model determination step for determining a context model to be used for each type of decoded data among a plurality of context models, which the context model is mutually determined by a context model used by an arithmetic coding process;
   a binarization step for generating a binarization rule defined based on the type of decoded data;
   a probability of occurrence generation step for providing a probability of occurrence corresponding to the context model determined by the binarization rule; and
   an arithmetic decoding step for arithmetic decoding based on said generated probability of occurrence and said initialized register value.

* * * * *